US 6,717,580 B1

(12) United States Patent
Tang

(10) Patent No.: US 6,717,580 B1
(45) Date of Patent: Apr. 6, 2004

(54) METHOD AND APPARATUS USING A LIST OF <MINIMUM, SIZE, GAP, OFFSET > QUADRUPLE TO ENCODE UNICODE CHARACTERS IN AN UPPER/LOWERCASE MAPPING

(75) Inventor: Frank Yung-Fong Tang, San Jose, CA (US)

(73) Assignee: America Online, Inc., Dulles, VA (US)

( * ) Notice: Subject to any disclaimer, the term of this patent is extended or adjusted under 35 U.S.C. 154(b) by 0 days.

(21) Appl. No.: 09/497,302

(22) Filed: Feb. 2, 2000

(51) Int. Cl.[7] ............................................. G06T 11/00
(52) U.S. Cl. .................... 345/467; 345/472.3; 345/556; 345/601; 345/636
(58) Field of Search ................................. 345/467, 468, 345/469, 469.1, 470, 471, 472.3, 588, 636, 555, 561–562, 556–557, 601; 341/26, 51, 87, 55; 382/177–179, 181–183, 195, 292, 242, 301, 244, 232; 707/1, 8

(56) References Cited

U.S. PATENT DOCUMENTS

| | | | | |
|---|---|---|---|---|
| 5,617,115 A | * | 4/1997 | Itoh .............................. 345/141 |
| 5,758,314 A | * | 5/1998 | McKenna ........................ 704/8 |
| 5,793,381 A | * | 8/1998 | Edberg et al. ............... 345/467 |
| 5,857,067 A | * | 1/1999 | Hassett et al. ............... 345/150 |
| 5,889,481 A | * | 3/1999 | Okada ........................... 341/51 |
| 5,929,792 A | * | 7/1999 | Herriot ......................... 341/55 |
| 5,939,700 A | * | 8/1999 | Ackley .................... 235/462.01 |
| 5,949,355 A | * | 9/1999 | Panaoussis .................. 341/51 |
| 6,012,638 A | * | 1/2000 | Ackley .................... 235/462.01 |
| 6,111,985 A | * | 8/2000 | Hullender ................... 382/229 |
| 6,166,666 A | * | 12/2000 | Kadyk ......................... 341/87 |
| 6,246,800 B1 | * | 6/2001 | Aitken ......................... 382/245 |
| 6,400,287 B1 | * | 6/2002 | Ehrman ........................ 341/55 |
| 6,421,680 B1 | * | 7/2002 | Kumhyr et al. .............. 707/103 |
| 6,422,476 B1 | * | 7/2002 | Ackley ........................ 235/294 |

OTHER PUBLICATIONS

*The Unicode Standard*, Addison Wesley Developers, 1996.
Frank Tang; *Unicode Case Mapping, Part 1*; http:/people.netscape.com/ftang/paper/unicode16/part1.html.
Davis et al. *Unicode*; Proceedings of the International Conference Systems, Man, and Cybernetics; US; New York, IEEE vol. 4; Nov. 1990; pp. 499–504.
Wolf M. et al. *Unicode Technical Report #6: A Standard Compression Scheme for Unicode, Revision 2.*; Internet Article; Sep. 30, 1998.

* cited by examiner

*Primary Examiner*—Matthew C. Bella
*Assistant Examiner*—Wesner Sajous
(74) *Attorney, Agent, or Firm*—Glenn Patent Group; Michael A. Glenn

(57) ABSTRACT

The invention provides basic 1-to-1 character case mapping information for Unicode characters while using only small amount of memory and at a reasonable speed. The presently preferred embodiment of the invention provides a technique that encodes the case mapping into a sequential list of <Minimum, Size, Gap, Offset> quadruple. Every quadruple represents a range of characters. The Minimum and Size values represent the boundary of the range. The Gap represents which characters in the range have the valid mapping. Thus, if the character Minimum is a multiple of the Gap, then the character has a mapping in the quadruple. Otherwise, the character does not have a mapping. If the character has a mapping, then the mapped value is the character plus the Offset.

23 Claims, 10 Drawing Sheets

C0 Controls and Basic Latin

|   | 000 | 001 | 002 | 003 | 004 | 005 | 006 | 007 |
|---|-----|-----|-----|-----|-----|-----|-----|-----|
| 0 | NUL | DLE | SP  | 0   | @   | P   | `   | p   |
| 1 | STX | DC1 | !   | 1   | A   | Q   | a   | q   |
| 2 | SOT | DC2 | "   | 2   | B   | R   | b   | r   |
| 3 | ETX | DC3 | #   | 3   | C   | S   | c   | s   |
| 4 | EOT | DC4 | $   | 4   | D   | T   | d   | t   |
| 5 | ENQ | NAK | %   | 5   | E   | U   | e   | u   |
| 6 | ACK | SYN | &   | 6   | F   | V   | f   | v   |
| 7 | BEL | ETB | '   | 7   | G   | W   | g   | w   |
| 8 | BS  | CAN | (   | 8   | H   | X   | h   | x   |
| 9 | HT  | EM  | )   | 9   | I   | Y   | i   | y   |
| A | LF  | SUB | *   | :   | J   | Z   | j   | z   |
| B | VT  | ESC | +   | ;   | K   | [   | k   | {   |
| C | FF  | FS  | ,   | <   | L   | \   | l   | \|  |
| D | CR  | GS  | -   | =   | M   | ]   | m   | }   |
| E | SO  | RS  | .   | >   | N   | ^   | n   | ~   |
| F | SI  | US  | /   | ?   | O   | _   | o   | DEL |

*FIG. 1*

C1 Controls and Latin-1 Supplement

| | 008 | 009 | 00A | 00B | 00C | 00D | 00E | 00F |
|---|---|---|---|---|---|---|---|---|
| 0 | CTRL 0080 | CTRL 0090 | NBSP 00A0 | ° 00B0 | À 00C0 | Ð 00D0 | à 00E0 | ð 00F0 |
| 1 | CTRL 0081 | CTRL 0091 | ¡ 00A1 | ± 00B1 | Á 00C1 | Ñ 00D1 | á 00E1 | ñ 00F1 |
| 2 | CTRL 0082 | CTRL 0092 | ¢ 00A2 | ² 00B2 | Â 00C2 | Ò 00D2 | â 00E2 | ò 00F2 |
| 3 | CTRL 0083 | CTRL 0093 | £ 00A3 | ³ 00B3 | Ã 00C3 | Ó 00D3 | ã 00E3 | ó 00F3 |
| 4 | CTRL 0084 | CTRL 0094 | ¤ 00A4 | ´ 00B4 | Ä 00C4 | Ô 00D4 | ä 00E4 | ô 00F4 |
| 5 | CTRL 0085 | CTRL 0095 | ¥ 00A5 | µ 00B5 | Å 00C5 | Õ 00D5 | å 00E5 | õ 00F5 |
| 6 | CTRL 0086 | CTRL 0096 | ¦ 00A6 | ¶ 00B6 | Æ 00C6 | Ö 00D6 | æ 00E6 | ö 00F6 |
| 7 | CTRL 0087 | CTRL 0097 | § 00A7 | · 00B7 | Ç 00C7 | × 00D7 | ç 00E7 | ÷ 00F7 |
| 8 | CTRL 0088 | CTRL 0098 | ¨ 00A8 | ¸ 00B8 | È 00C8 | Ø 00D8 | è 00E8 | ø 00F8 |
| 9 | CTRL 0089 | CTRL 0099 | © 00A9 | ¹ 00B9 | É 00C9 | Ù 00D9 | é 00E9 | ù 00F9 |
| A | CTRL 008A | CTRL 009A | ª 00AA | º 00BA | Ê 00CA | Ú 00DA | ê 00EA | ú 00FA |
| B | CTRL 008B | CTRL 009B | « 00AB | » 00BB | Ë 00CB | Û 00DB | ë 00EB | û 00FB |
| C | CTRL 008C | CTRL 009C | ¬ 00AC | ¼ 00BC | Ì 00CC | Ü 00DC | ì 00EC | ü 00FC |
| D | CTRL 008D | CTRL 009D | - 00AD | ½ 00BD | Í 00CD | Ý 00DD | í 00ED | ý 00FD |
| E | CTRL 008E | CTRL 009E | ® 00AE | ¾ 00BE | Î 00CE | Þ 00DE | î 00EE | þ 00FE |
| F | CTRL 008F | CTRL 009F | ¯ 00AF | ¿ 00BF | Ï 00CF | ß 00DF | ï 00EF | ÿ 00FF |

*FIG. 2*

Latin Extended-A

| | 010 | 011 | 012 | 013 | 014 | 015 | 016 | 017 |
|---|---|---|---|---|---|---|---|---|
| 0 | Ā 0100 | Đ 0110 | Ġ 0120 | İ 0130 | Ŀ 0140 | Ő 0150 | Š 0160 | Ű 0170 |
| 1 | ā 0101 | đ 0111 | ġ 0121 | ı 0131 | Ł 0141 | ő 0151 | š 0161 | ű 0171 |
| 2 | Ă 0102 | Ē 0112 | Ģ 0122 | IJ 0132 | ł 0142 | Œ 0152 | Ţ 0162 | Ų 0172 |
| 3 | ă 0103 | ē 0113 | ģ 0123 | ij 0133 | Ń 0143 | œ 0153 | ţ 0163 | ų 0173 |
| 4 | Ą 0104 | Ĕ 0114 | Ĥ 0124 | Ĵ 0134 | ń 0144 | Ŕ 0154 | Ť 0164 | Ŵ 0174 |
| 5 | ą 0105 | ĕ 0115 | ĥ 0125 | ĵ 0135 | Ņ 0145 | ŕ 0155 | ť 0165 | ŵ 0175 |
| 6 | Ć 0106 | Ė 0116 | Ħ 0126 | Ķ 0136 | ņ 0146 | Ŗ 0156 | Ŧ 0166 | Ŷ 0176 |
| 7 | ć 0107 | ė 0117 | ħ 0127 | ķ 0137 | Ň 0147 | ŗ 0157 | ŧ 0167 | ŷ 0177 |
| 8 | Ĉ 0108 | Ę 0118 | Ĭ 0128 | ĸ 0138 | ň 0148 | Ř 0158 | Ũ 0168 | Ÿ 0178 |
| 9 | ĉ 0109 | ę 0119 | ĭ 0129 | Ĺ 0139 | ŉ 0149 | ř 0159 | ũ 0169 | Ź 0179 |
| A | Ċ 010A | Ě 011A | Ī 012A | í 013A | Ŋ 014A | Ś 015A | Ū 016A | ź 017A |
| B | ċ 010B | ě 011B | ī 012B | Ļ 013B | ŋ 014B | ś 015B | ū 016B | Ż 017B |
| C | Č 010C | Ĝ 011C | Ĭ 012C | ļ 013C | Ō 014C | Ŝ 015C | Ŭ 016C | ż 017C |
| D | č 010D | ĝ 011D | ĭ 012D | Ľ 013D | ō 014D | ŝ 015D | ŭ 016D | Ž 017D |
| E | Ď 010E | Ğ 011E | Į 012E | ľ 013E | Ŏ 014E | Ş 015E | Ů 016E | ž 017E |
| F | ď 010F | ğ 011F | į 012F | Ŀ 013F | ŏ 014F | ş 015F | ů 016F | ſ 017F |

*FIG. 3*

METHOD AND APPARATUS USING A LIST OF <MINIMUM, SIZE, GAP, OFFSET> QUADRUPLE TO ENCODE UNICODE CHARACTERS IN AN UPPER/LOWERCASE MAPPING

BACKGROUND OF THE INVENTION

1. Technical Field

The invention relates to character mapping. More particularly, the invention relates to a method and apparatus using a list of <minimum, size, gap, offset> quadruple to encode Unicode characters in an upper/lower case character mapping.

2. Description of the Prior Art

The Unicode standard, version 2.0 (UCS2) specifies character coding. The majority of the Unicode characters map to one Unicode for each character case mapping. Therefore, a solid implementation of a basic 1-to-1 character case mapping is an important foundation for a general locale sensitive, contextual based Unicode string case mapping. There are 65,536 (63,488 if one ignores surrogates) possible bit combinations of UCS2. The Unicode 3.0 standard allocates 57,709 characters. There are 10,617 entries in the Unicode character database (based on the Unicode 3.0 standard). There are 1,398 UCS2 characters which have a different case (see, for example, FIGS. 1–3).

It is highly desirable to provide basic 1-to-1 character case mapping information while using only small amount of memory and at a reasonable speed. Character mapping in Unicode is, at best, an onerous task. One problem with mapping Unicode characters is that of mapping between upper and lower case characters.

The problem may be stated as follows:

Given one Unicode string as input, output the upper (or lower) case string:

"unicode"->"UNICODE"

Various attempts have been made to solve this problem. These approaches include: a conditional offset; a flat array; an indirect array; a list of a mapping pair; and a compact array.

Conditional Offset

This approach is used widely in the early 7-bit US-ASCII implementation.
Data Structure & Algorithm
  To upper case:

output=(('a'<=input)&&(input<='z'))?(input-'a'+'A'):input;

To lower case:

output=(('A'<=input)&&(input<='Z'))?(input-'A'+'a'):input;

Result

This algorithm is very simple and compact. It basically compresses the case mapping information into three bytes for 7-bits US-ASCII. This algorithm is based on the assumption of the following important characteristics of the 7-bits US-ASCII definition:

1. All the lower case characters are encoded in a continuous range;
2. All the upper case characters are encoded in a continuous range; and
3. All the lower case characters have an equal offset to corresponding upper case characters.

The assumptions above do not fit for most other character sets (charset). The same approach applied to ISO-8859-1 requires three if statements. This approach is not general enough for other charsets. For Unicode, the required number of if statements is too big for any practical implementation of this approach.

Flat Array

The conditional offset approach lacks flexibility and is not general enough for other charsets. In the early 1980's 8-bit charsets, such as ISO-8859-1, came into use. With the increased use of these charsets came a more flexible approach to solving the problem of character mapping for upper/lower case characters,. i.e. the flat array. The flat array requires considerable memory, but provides improved flexibility and performance. In fact, the flat array is still the preferred implementation for most single byte charsets.
Data Structure & Algorithm Use a flat array to contain the information. Use the input byte as the array index. Return the value of the array element as the output.

output=ToUpper[input];

Result

This approach uses more memory than the conditional offset approach. However, the performance is faster. It is a good choice when the total possible number of inputs is limited to less than or equal to 256 inputs. This approach is not practical for any multi-byte charset, such as Shift_JIS or Big 5. It therefore is not practical for use with Unicode. If this approach is used for multibyte charsets, then a significant amount of memory is required for the array.

For a single byte, the required memory for both an upper case and a lower case mapping is:

2[upper and lower]×1[sizeof(char)=1 bytes]×256[28=256]=512 bytes.

For Unicode or other two byte charset, the required memory becomes:

2[upper and lower]×2[sizeof(UCS2)=2 bytes]×65536[216=65535]= 262,144 bytes.

While this approach is preferred for most single byte charset implementations, it is not a practical approach to implement Unicode or other multi-byte charsets.

Indirect Array

After studying the distribution of the case characters in Unicode, it can be noted that all of the characters are encoded in several localized regions of the 16-bits space. If the 16-bits space is divided equally into 256 blocks, each block has 256 Unicodes, and all of the case characters are encoded in eleven of these blocks (see, for example, FIGS. 1–3).

The remaining 245 blocks do not encode any 1-to-1 case characters. Thus, it is possible to reduce the size of the memory required by the flat array approach by applying one level of indirection. The indirect array approach uses one flat array for each block and saves 245 flat arrays for those blocks which do not have 1-to-1 case characters.

The distribution of case characters in these blocks is set forth in Table 1 below.

TABLE 1

Distribution of Case Characters

| U+_xx | 00 | 01 | 02 | 03 | 04 | 05 | 1E | 1F | 21 | 24 | FF | Total |
|---|---|---|---|---|---|---|---|---|---|---|---|---|
| Number of case sensitive characters | 114 | 239 | 69 | 97 | 230 | 76 | 241 | 193 | 35 | 52 | 52 | 1398 |

Data Structure & Algorithm
   if(array[input >>8])
      output=array[input>>8][input & 0x0FF]
   else
      output=input;
Result
   This approach requires:

2[2=lower and upper]×11["cut–d; –f1,13,14 UnicodeData-Latest.txt|egrep–v ";;$"|cut–c1–2|uniq|wc–l"=>11]×2[sizeof(UCS2)=2]×256[block size is 256]=11,264 bytes for all the eleven blocks. Additional memory may be needed for the first index array. However, this step could be replaced by several if statements. The performance of this algorithm is slower than both algorithms above, but the amount of memory that is required is greatly reduced.

List of Mapping Pair

Because it is known that there are only 1,389 1-to-1 case characters, one can also compress this information into an array of <input, output> pairs and use a binary search to find the desired information.
Data Structure & Algorithm
   if( entry=BinarySearch(input, list))
      output=entry->out;
   else
      output=input;
Result
Because a search process is required, the algorithm is slower, but the amount of memory required is only:

2[2=in and out]×2[sizeof(UCS2)=2]×1398[Total number of entries in UnicodeData-Latest.txt which contains case information is 1,398 (see above)]×2=5,592 bytes.

Because there are 1,398 entries, the depth of the binary search is 10 or 11 [$2^{10}$<1,398<$2^{11}$].

Compact Array

Java and ICU use a compact array to encode Unicode character properties in general. They also apply the same approach for case mapping.
Data Structure & Algorithm
   output=array2 [array 1 [input>>WINDOW_SIZE_BITS]][input & WINDOW_MASK];
   See FIG. 4. In ICU 1.3.1 (icu/source/common/uchar.c), this approach first checks the case of the input character itself. This check is done by one compact array (array indices and values in uchar.c ). For ToUpper operation, if the case of the input character is lower case, then this approach uses a second compact array (caseIndex and caseValue in uchar.c) to determine the value of the other case.
Result
In ICU-icu/source/common/uchar.c [based on ICU-1.3.1], this approach uses 64 as the window size. Table 2 shows the size of the table.

TABLE 2

Table Size

| Array Name | To decide upper/lower case | | To map to the "other" case | | Total |
|---|---|---|---|---|---|
| in uchar.c | indices | values | caseIndex | caseValue | |
| Type of Array | uint16_t (2 bytes) | int8_t (1 byte) | uint16_t (2 bytes) | int16_t (2 bytes) | |
| Number of Elements | 512 | 10,234 | 512 | 2,304 | |
| Size in byte | 1,024 | 10,234 | 1,024 | 4,608 | 16,890 |
| | 1,024 + 10,234 = 11,258 | | 1,024 + 4,608 = 5,632 | | |

The number of bytes listed here represent the total memory needed to implement both case mapping and character category checking. Therefore, it is not fair to say the required memory is 16,890 bytes. However, the required memory is at least 5,632 bytes for mapping to "the other case."

It would be desirable to provide basic 1-to-1 character case mapping information while using only small amount of memory and at a reasonable speed.

SUMMARY OF THE INVENTION

The invention provides basic 1-to-1 character case mapping information while using only small amount of memory and at a reasonable speed. The solution to this problem can be expressed as follows:

Given a Unicode character as input, convert it to the corresponding upper case character in Unicode.

Given a Unicode character as input, convert it to the corresponding lower case character in Unicode.

Implement the functionality above by using a small amount of memory with fast performance.

The presently preferred embodiment of the invention provides a technique that encodes the case mapping into a sequential list of <Minimum, Size, Gap, Offset> quadruple. Every quadruple represents a range of characters. The Minimum and Size values represent the boundary of the range. The Gap represents which characters in the range have the valid mapping. Thus if the character Minimum is a multiple of the Gap, then the character has a mapping in the quadruple. Otherwise, the character does not have a mapping. If the character has a mapping, then the mapped value is the character plus the Offset.

The preferred algorithm for the to-lower (or to-upper) function is as follows:

1. Given input character C and the case mapping encoded in the sequential list of <MIN, SIZE, GAP, OFFSET> quadruple L, use sixteen bits to encode MIN and OFF, use eight bits to encode SIZE and GAP.

2. Binary search C on the sequential list of <MIN, SIZE, GAP, OFFSET> quadruple L. If ( MIN<=C && (C<= (MIN+SIZE)) then find the match quadruple Q. Otherwise, continue binary search. If a match cannot be found for quadruple Q, the mapped value of character C is C itself (non caseable character, such as a digit or Chinese Han character).
3. If GAP in Q is 1 ((C−MIN) % GAP) equal to zero, the mapped value of character C is (C+OFF). The OFF could be negative number, otherwise, the mapped value of character C is C itself.
4. By using this method, the whole Unicode 2.0 case mapping can be encoded in 618 bytes (103 quadruple, 6 bytes each) for the to-upper mapping, and 576 bytes (96 quadruple, 6 bytes each) for the to-lower mapping.

The invention takes account of the following characteristic of the code point assignment of casing characters in Unicode standard to make the compression more efficiency:

Some scripts/blocks do not distinguish upper case and lower case at all. For those scripts/blocks, there is no need to encode upper/lower case mappings.

When the Unicode standard assigns a code point for a caseable character, it usually either:
assigns a whole group of lower case characters together and puts the corresponding upper case characters together in the same sequence; or
assigns the upper case (or lower case) character next to it and repeats the same kind of assignment for a block of characters.

There are a limited number of such groups, such that the depth of the binary search is limited.

Every group is smaller than 256 characters, such that eight bits can be used to represent the SIZE in the quadruple.

The GAP is smaller than 256 characters, such that eight bits can be used to represent the GAP in the quadruple.

BRIEF DESCRIPTION OF THE DRAWINGS

FIG. 1 is a table showing Unicode character codes for basic Latin characters;

FIG. 2 is a table showing Unicode character codes for Latin-1 supplement characters;

FIG. 3 is a table showing Unicode character codes for Latin extended-A characters;

DETAILED DESCRIPTION OF THE INVENTION

Figure 4:
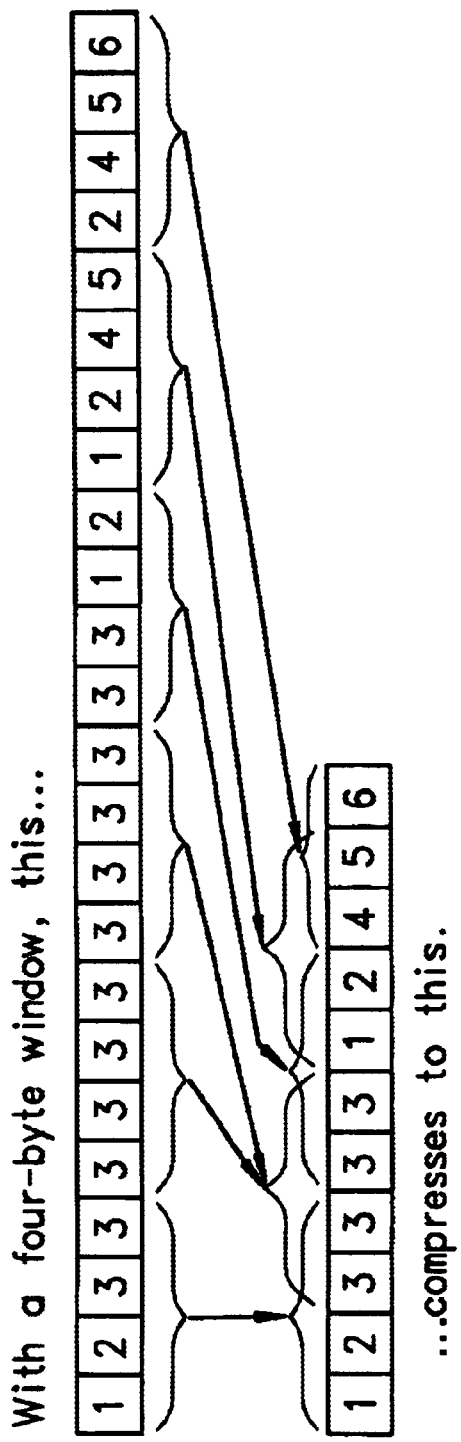
FIG. 4 is a block schematic diagram showing operation of a compact array.
Figure 5:
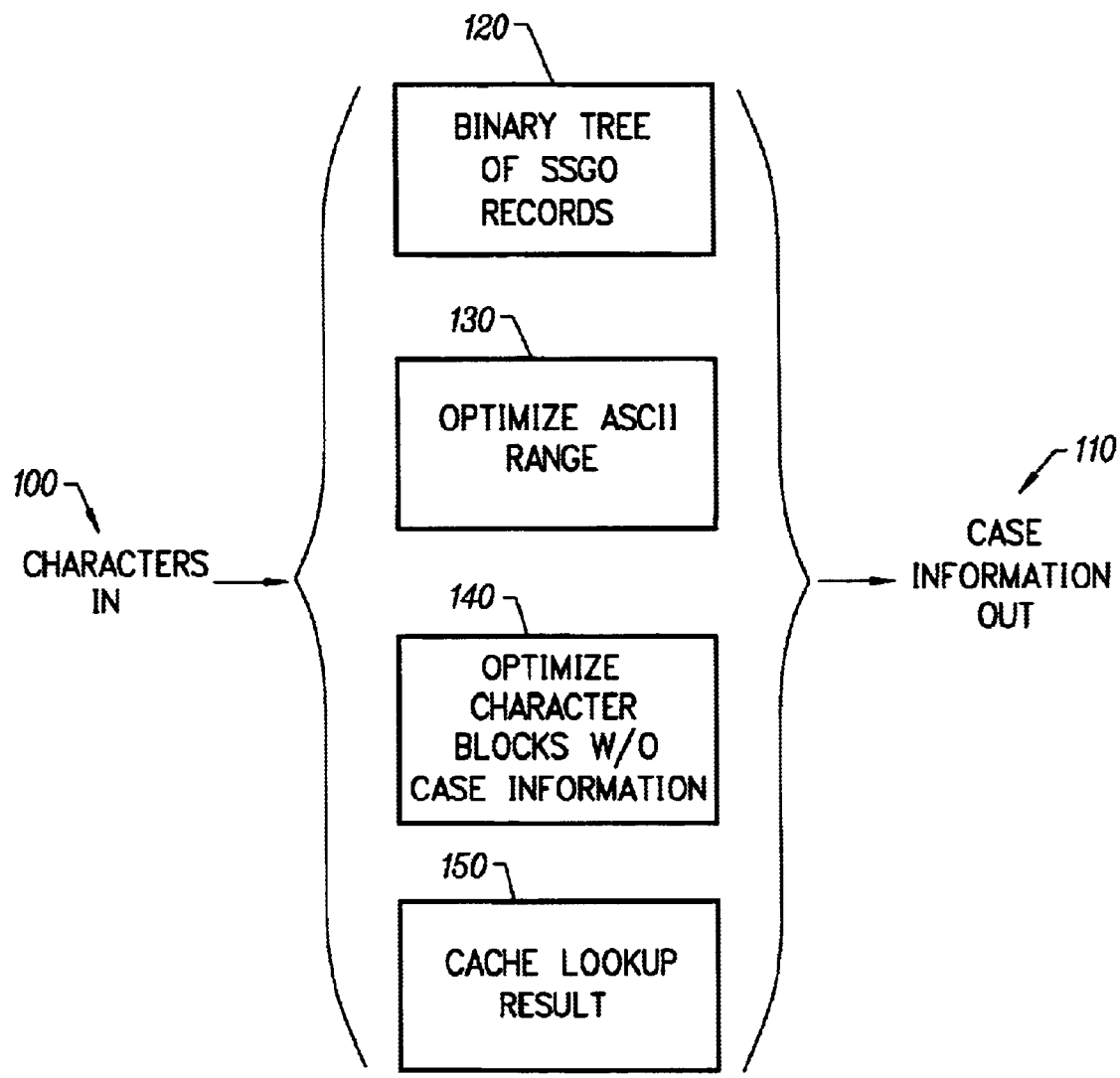
FIG. 5 is a block schematic diagram of a method and apparatus using a list of <minimum, size, gap, offset> quadruple to encode Unicode characters in an upper/lower case character mapping according to the invention.

FIG. 5 is a block schematic diagram of a method and apparatus using a list of <minimum, size, gap, offset> quadruple to encode Unicode characters in an upper/lower case character mapping according to the invention. The presently preferred embodiment of the invention addresses the following problem: Given one Unicode string as input, output the upper (or lower) case string:

"unicode"->"UNICODE"

This problem can be divided into the following smaller problems:

A while loop to process one Unicode at a time;

Map one Unicode to the Unicode's upper case, basic 1-to-1 character case mapping; and Handle special case mapping:

1-to-N UCS2 character case mapping, Map 1 UCS2 to N UCS2:
Special mapping: Example: "β" to "SS";
Ligatures;
Precomposed characters;
contextual case mapping; and
Surrogate characters in the future?

N-to-M UCS2 character case mapping, Map N UCS2 to M UCS2:
N-to-1?
Surrogate characters in the future?

Locale sensitive override:
Turkish i/I and dotless i/I.

Basic 1-to-1 Character Case Mapping

Steps

The invention takes the following steps to solve the problem of providing basic 1-to-1 character case mapping information. For characters in (100), provide characters out (110) by the following steps:

Compress the 1-to-1 case mapping information by using minimum memory (120);

Optimize the performance of the table lookup:
Optimization for ASCII range (130);
Optimization for characters which have no case information (140); and
Optimization by using cache (150).

Compress 1-to-1 Character Case Mapping Information

Problem

There are 1,398 entries in the Unicode character database that contain case information of the total number of 65,535 possible entries in the 16-bit domain of the database. This case information must be compressed into smallest amount of memory as possible.

The preferred embodiment of the invention is based on the observation of the relationship between the lower case and upper case characters and their distribution in the current version of the Unicode standard:

Lower case characters in one range, upper case characters in another range. Both in the same order:
ASCII;
Basic Latin (Latin 1);

Upper case after lower case in one range:
Latin Extend-A;

Other exceptions.

Binary Tree of Start/Size/Gap/Offset (SSGO) Record

The preferred embodiment of the invention first makes the size of table as small as possible.

Compress the case mapping information into a binary tree of SSGO (<Start, Size, Gap, Offset>) record. This is the most compact way to hold case mapping information for Unicode at present (for Unicode 3.0). The table is generated by using a gencasetable.pl (see Table 4 below), which is a Perl script, to read the Unicode database (see Appendix A). The generated result is stored in a C header file casetable.h (see Table 5 below).

The presently preferred embodiment of the invention provides a technique that encodes the case mapping into a sequential list of <Minimum, Size, Gap, Offset> quadruple. Every quadruple represents a range of characters. The Minimum and Size values represent the boundary of the range. The Gap represents which characters in the range have the valid mapping. Thus, if the character Minimum is a multiple of the Gap, then the character has a mapping in the quadruple. Otherwise, the character does not have a mapping. If the character has a mapping, then the mapped value is the character plus the Offset.

The preferred algorithm for the to-lower (or to-upper) function is as follows:

1. Given input character C and the case mapping encoded in the sequential list of <MIN, SIZE, GAP, OFFSET> quadruple L, use sixteen bits to encode MIN and OFF, use eight bits to encode SIZE and GAP.
2. Binary search C on the sequential list of <MIN, SIZE, GAP, OFFSET> quadruple L. If (MIN<=C && (C<= (MIN+SIZE)) then find the match quadruple Q. Otherwise, continue binary search. If a match cannot be found for quadruple Q, the mapped value of character C is C itself (non caseable character, such as a digit or Chinese Han character).
3. If GAP in Q is 1 ((C−MIN) % GAP) equal to zero, the mapped value of character C is (C+OFF). The OFF could be negative number, otherwise, the mapped value of character C is C itself.
4. By using this method, the whole Unicode 2.0 case mapping can be encoded in 618 bytes (103 quadruple, 6 bytes each) for the to-upper mapping, and 576 bytes (96 quadruple, 6 bytes each) for the to-lower mapping.

The invention takes account of the following characteristic of the code point assignment of casing characters in Unicode standard to make the compression more efficient:

Some scripts/blocks do not distinguish upper case and lower case at all. For those scripts/blocks, there is no need to encode upper/lower case mappings.

When the Unicode standard assigns a code point for a caseable character, it usually either:

assigns a whole group of lower case characters together and puts the corresponding upper case characters together in the same sequence; or assigns the upper case (or lower case) character next to it and repeats the same kind of assignment for a block of characters.

There are a limited number of such groups, such that the depth of the binary search is limited.

Every group is smaller than 256 characters, such that eight bits can be used to represent the SIZE in the quadruple.

The GAP is smaller than 256 characters, such that eight bits can be used to represent the GAP in the quadruple.

Table 3 below shows the binary tree.

TABLE 3

Binary Tree of SSGO Record

| | Start | Size (=End− Start) | Gap | Offset | Total |
|---|---|---|---|---|---|
| Type Byte(s) needed | PRUnichar 2 bytes | PRUint8 1 byte | PRUint8 1 byte | PRInt16 2 bytes | 6 bytes |

TABLE 4 gencasetable.pl

```
 1 #!/usr/bin/perl
 2 #
 3 # The contents of this file are subject to the Netscape Public
 4 # License Version 1.1 (the "License"); you may not use this file
 5 # except in compliance with the License. You may obtain a copy of
 6 # the License at http://www.mozilla.org/NPL/
 7 #
 8 # Software distributed under the License is distributed on an "AS
 9 # IS" basis, WITHOUT WARRANTY OF ANY KIND, either express or
10 # implied. See the License for the specific language governing
11 # rights and limitations under the License.
12 #
13 # The Original Code is mozilla.org code.
14 #
15 # The Initial Developer of the Original Code is Netscape
16 # Communications Corporation. Portions created by Netscape are
17 # Copyright (C) 1999 Netscape Communications Corporation. All
18 # Rights Reserved.
19 #
20 # Contributor(s):
21 #
22
23
##################################################################
```

TABLE 4-continued gencasetable.pl

```
24  #
25  # Initial global variable
26  #
27
########################################################################
28  %utot = ( ) ;
29  $ui=0;
30  $li=0;
31
32
########################################################################
33  #
34  # Open the unicode database file
35  #
36
########################################################################
37  open ( UNICODATA , "< UnicodeData-Latest.txt")
38          || die "cannot find UnicodeDta-Latest.txt";
39
40
########################################################################
41  #
42  # Open the output file
43  #
44
########################################################################
45  open ( OUT , "> . ./src/casetable.h")
46          || die "cannot open output . ./src/casetable.h file";
47
48
########################################################################
49  #
50  # Generate licese and header
51  #
52
########################################################################
53  $npl = <<END_OF_NPL;
54  /* -*- Mode: C; tab-width: 4; indent-tabs-mode: nil; c-basic-offset: 2 -*-
55   *
56   * The contents of this file are subject to the Netscape Public License
57   * Version 1.0 (the "NPL"); you may not use this file except in
58   * compliance with the NPL. You may obtain a copy of the NPL at
59   * http://www.mozilla.org/NPL/
60   *
61   * Software distributed under the NPL is distributed on an "AS IS" basis,
62   * WITHOUT WARRANTY OF ANY KIND, either express or implied. See the NPL
63   * for the specific language governing rights and limitations under the
64   * NPL.
65   *
66   * The Initial Developer of this code under the NPL is Netscape
67   * Communications Corporation. Portions created by Netscape are
68   * Copyright (C) 1999 Netscape Communications Corporation. All Rights
69   * Reserved.
70   */
71  /*
72          DO NOT EDIT THIS DOCUMENT !!! THIS DOCUMENT IS GENERATED BY
73          mozilla/intl/unicharutil/tools/gencasetable.pl
74  */
75  END_OF_NPL
76  print OUT $npl;
77
78  print OUT "#include \"nscore.h\ \n\n";
79
80
########################################################################
81  #
82  # Process the file line by line
83  #
84
########################################################################
85  while(<UNICODATA>) {
86      chop;
87
########################################################################
88      #
89      # Get value from fields
90      #
```

TABLE 4-continued gencasetable.pl

```
91
     ####################################################################
92       @f = split(/;/ , $_) ;
93       $c = $f[0];     # The unicode value
94       $u = $f[12];    # The upper case
95       $l = $f[13];    # The lower case
96       $t = $f[14];    # The title case
97
98       #
99       # print $c . " | " . $u . \ | " . $1 . " | " . St . "/n";
100      #
101
102
     ####################################################################
103      #
104      # Process title case for this entry
105      #
106
     ####################################################################
107      #
108      # if upper case is not equal to title case, store into
109      # %utot hash
110      #
111
112      if ( ( $t ne " ") && ($u ne " ") && ( $u ne $t ) ) {
113         #
114         # print $c . " | " . $u . " | " . $1 . " | " . $t . "\n";
115         #
116         $utot{$u} = $t;
117      }
118
119      $cv = hex($c);         # convert the Unicode value into integer
120
121
     ####################################################################
122      #
123      # Process upper case for this entry
124      #
125
     ####################################################################
126      if( $u ne " ") {        # if upper case exist
127         $uvalue = hex($u);   # convert the upper case value into integer
128
129
     ####################################################################
130      # store related information into arrays
131      # @ucv        - unicode value
132      # @uv         - upper case value (debug only)
133      # @ud         - difference between unicode and upper case
134      # @ulastd     - difference between unicode and last unicode in the entry
135
     ####################################################################
136
137      $ucv[$ui] = $cv;
138      $uv[$ui] = $uvalue;
139      $ud[$ui] = 0x0000FFFF & ($uvalue - $cv);
140
141      if( $ui ne 0) {
142         $ulastd[$ui] = $cv - $ucv[$ui-1];
143      }
144      $ui++;
145      }
146
147
     ####################################################################
148      #
149      # Process lower case for this entry
150      #
151
     ####################################################################
152      if( $1 ne " ") {        # if lower case exist
153         $lvalue = hex($1); # convert the lower case value into integer
154
155
     ####################################################################
156      # store related information into arrays
157      # @lcv        - unicode value
```

TABLE 4-continued gencasetable.pl

```
158    # @lv       - lower case value (debug only)
159    # @ld       - difference between unicode and lower case
160    # #llastd   - difference between unicode and last unicode in the entry
161
################################################################
162
163    $lcv[$li] = $cv;
164    $lv[$li] = $lvalue;
165    $ld[$li] = 0X0000FFFF & ($lvalue - $cv);
166
167    if( $li ne 0) {
168        $llastd[$li] = $cv - $lcv[$li-1];
169    }
170    $li++;
171    }
172
173 }
174
175
176
################################################################
177 #
178 # Print out all the tables
179 #
180
################################################################
181
182
################################################################
183 #
184 # Print out upper to title case mapping
185 #
186
################################################################
187
188 $ttotal = 0;
189 print OUT "static PRUnichar gUpperToTitle[ ] = { \n";
190 while(($upper, $title) = each(%utot)) {
191     print OUT " 0x" . $upper . ", 0x" . $utot{$upper} . ", \n";
192     $ttotal++;
193 }
194 print OUT "};\n\n";
195 print OUT "static PRUint32 gUpperToTitleItems = $ttotal;\n\n";
196
197
################################################################
198 #
199 # Print out gToUpper table
200 #
201
################################################################
202 print OUT "static PRUint16 gToUpper[ ] = \n";
203 print OUT "{ /* From To Every Diff */ \n";
204 $utotal=0;
205 $ufrom = 0; # remember the start of the output item
206 for ($i = 0; $i <= $#ucv; $i++)
207 {
208     if(0 eq $i) {
209
################################################################
210     #
211     # Print the first item in the array
212     #
213
################################################################
214     $ufrom = $ucv[0];
215     printf OUT " 0x%04x, " , $ucv[0];
216     } else {
217
################################################################
218     #
219     # Print all the item except the first and last one
220     # only print if the upper case difference is different from the
221     # and the difference between last entry changed
222     #
223
################################################################
```

TABLE 4-continued gencasetable.pl

```
224     if( ($ud[i] ne $ud[$i-1]) ||
225         ( ($ufrom ne $ucv[$i-1]) && ($ulastd[$i] ne $ulastd[$i-1]) ) ) {
226
227         $every = 0;
228         if($ufrm ne $ucv[$i-1])
229         {
230             $every = $ulastd[$i-1];
231         }
232
233         printf OUT " ((0x%02x << 8) | 0x%02x), 0x%04x ,\n",
234             ($ucv[$i-1] - $ufrom), $every, $ud[$i-1];
235
236         if((($ucv[$i-1] - $ufrom) > 255) || ($every > 255)) {
237             print "WARNNING!!! cannot handle block > 255 chars (Upper) \n\n";
238             printf "0x%04X, 0x%04x, 0x%04x), 0x%04x \n",
239                 $ufrom, $ucv[$i-1], $every, $ud[$i-1];
240         }
241
242         $ufrom = $ucv[$i];    # update the start of the item
243         printf OUT "           0x%04x, " , $ufrom;
244         $utotal++;
245     }
246     }
247     if( $i eq $#ucv) {
248
######################################################################
249     #
250     # Print the last item in the array
251     #
252
######################################################################
253     printf OUT "( (0x%02x << 8) " 0x%02x), 0x%04x \n};\n\n",
254         ($ucv[$i] - $ufrom), $ulastd[$i], $ud[$i];
255     $utotal++;
256     print OUT "static PRUint32 gToUpperItems = $utotal;\n\n";
257     }
258     #
259         # printf "%4x - %4x - %4x - %4x\n", $ucv[$i], $uv[$i], $ud[$i], $ulastd[$i];
260     #
261 }
262
263
######################################################################
264 #
265 # Print out gToLower table
266 #
267
######################################################################
268 print OUT "static PRUInt16 gToLower[ ] = \n";
269 print OUT "{ /* From To Every Diff */ \n";
270 $ltotal=0;
271 $lfrom = 0; # remember the start of the output item
272 for ($i = 0; $i <= $#lcv; $i++)
273 {
274     if(0 eq $i) {
275
######################################################################
276     #
277     # Print the first item in the array
278     #
279
######################################################################
280     $lfrom = $lcv[0];
281     printf OUT " 0x%04x, " , $lcv[0];
282     } else {
283
######################################################################
284     #
285     # Print all the item except the first and last one
286     # only print if the lower case difference is different from the
287     # and the difference between last entry changed
288     #
289
######################################################################
290     if(($ld[$i] ne $ld[$i-1]) ||
291         ( ($lfrom ne $cv[$i-1]) && ($llastd[$i] ne $llastd[$i-1]) ) ) {
292
```

TABLE 4-continued gencasetable.pl

```
293         $every = 0;
294         if($lfrom ne $lcv[$i-1])
295         {
296             $every = $llastd[$i-1];
297         }
298
299         printf OUT " ( (0x%02x << 8) | 0x%02xf), 0x%04x ,\n",
300             ($lcv[$i-1] - $lfrom) , $every, $ld[$i-1];
301
302         if ( ( ($lcv[$i-1] - $lfrom) > 255) || ($every > 255) ) {
303             print "WARNNING! ! ! cannot handle block > 255 chars (Lower)\n\n";
304             print "0x%04X, 0x%04x, 0x%04x, 0x%04x \n",
305                 $lfrom, $lcv[$i-1], $every, $ld[$i-1];
306         }
307         $lfrom = $lcv[$i];  # upadate the start of the item
308         printf OUT "      0x%04x, " , $lfrom;
309         $ltotal++;
310     }
311     }
312     if( $i eq $#lcv) {
313
######################################################################
314     #
315     # Print the last item in the array
316     #
317
######################################################################
318     printf OUT " ( (0x%02x << 8) | 0x%02x), 0x%04x \n};\n\n",
319         ($lcv[$i] - $lfrom), $llastd[$i], $ld[$i];
320     $ltotal++;
321     print OUT "static PRUint32 gToLowerItems = $ltotal;\n\n";
322     }
323     #
324     # printf "%4x - %4 - %4 - %4\n", $lcv[$i], $lv[$i], $ld[$i], $llastd[$i];
325     #
326 }
327
328
329
######################################################################
330 #
331 # Close files
332 #
333
######################################################################
334 close(UNIDATA);
335 close(OUT);
336
```

TABLE 5 casetable.h

```
1  /* -*- Mode: C; tab-width: 4; indent-tabs-mode: nil; c-basic-offset: 2 -*-
2   *
3   * The contents of this file are subject to the Netscape Public
4   * License Version 1.1 (the "License"); you may not use this file
5   * except in compliance with the License. You may obtain a copy of
6   * the License at http://www.mozilla.org/NPL/
7   *
8   * Software distributed under the License is distributed on an "AS
9   * IS" basis, WITHOUT WARRANTY OF ANY KIND, either express or
10  * implied. See the. License for the specific language governing
11  * rights and limitations under the License.
12  *
13  * The Original Code is mozilla.org code.
14  *
15  * The Initial Developer of the Original Code is Netscape
16  * Communications Corporation. Portion's created by Netscape are
17  * Copyright (C) 1999 Netscape Communications Corporation. All
18  * Rights Reserved.
19  *
20  * Contributor(s)
21  */
```

TABLE 5-continued casetable.h

```
22 /*
23       DO NOT EDIT THIS DOCUMENT !!! THIS DOCUMENT IS GENERATED BY
24       mozilla/intl/unicharutil/tools/gencasetable.pl
25  */
26 # include "nscore.h"
27
28 static PRUnichar gUpperToTitle[ ] = {
29    0x01F1,    0x01F2,
30    0x01C4,    0x01C5,
31    0x01C7,    0x01C8,
32    0x01CA,    0x01CB,
33 };
34
35 static PRUint32 gUpperToTitleItems = 4;
36
37 static PRUint16 gToUpper[ ] =
38 { /* From      To                Every    Diff     */
39      0x0061,   ((0x19 << 8)   |  0x01),   0xffe0   ,
40      0x00e0,   ((0x16 << 8)   |  0x01),   0xffe0   ,
41      0x00f8,   ((0x06 << 8)   |  0x01),   0xffe0   ,
42      0x00ff,   ((0x00 << 8)   |  0x01),   0x0079   ,
43      0x0101,   ((0x2e << 8)   |  0x02),   0xffff   ,
44      0x0131,   ((0x00 << 8)   |  0x02),   0xff18   ,
45      0x0133,   ((0x04 << 8)   |  0x02),   0xffff   ,
46      0x013a,   ((0x0e << 8)   |  0x02),   0xffff   ,
47      0x014b,   ((0x2c << 8)   |  0x02),   0xffff   ,
48      0x017a,   ((0x04 << 8)   |  0x02),   0xffff   ,
49      0x017f,   ((0x00 << 8)   |  0x01),   0xfed4   ,
50      0x0183,   ((0x02 << 8)   |  0x02),   0xffff   ,
51      0x0188,   ((0x04 << 8)   |  0x04),   0xffff   ,
52      0x0192,   ((0x07 << 8)   |  0x07),   0xffff   ,
53      0x01a1,   ((0x04 << 8)   |  0x02),   0xffff   ,
54      0x01a8,   ((0x05 << 8)   |  0x05),   0xffff   ,
55      0x01b0,   ((0x04 << 8)   |  0x04),   0xffff   ,
56      0x01b6,   ((0x03 << 8)   |  0x03),   0xffff   ,
57      0x01bd,   ((0x08 << 8)   |  0x08),   0xffff   ,
58      0x01c6,   ((0x00 << 8)   |  0x01),   0xfffe   ,
59      0x01c8,   ((0x00 << 8)   |  0x02),   0xffff   ,
60      0x01c9,   ((0x00 << 8)   |  0x01),   0Yfffe   ,
61      0x01cb,   ((0x00 << 8)   |  0x02),   0xffff   ,
62      0x01cc,   ((0x00 << 8)   |  0x01),   0xtffe   ,
63      0x01ce,   ((0x0e << 8)   |  0x02),   0xffff   ,
64      0x01dd,   ((0x00 << 8)   |  0x01),   0xffb1   ,
65      0x01df,   ((0x10 << 8)   |  0x02),   0xffff   ,
66      0x01f2,   ((0x00 << 8)   |  0x03),   0xffff   ,
67      0x01f3,   ((0x00 << 8)   |  0x01),   0xfffe   ,
68      0x01f5,   ((0x06 << 8)   |  0x06),   0xffff   ,
69      0x01fd,   ((0x1a << 8)   |  0x02),   0xffff   ,
70      0x0253,   ((0x00 << 8)   |  0x3c),   0xff2e   ,
71      0x0254,   ((0x00 << 8)   |  0x01),   0xff32   ,
72      0x0256,   ((0x01 << 8)   |  0x01),   0xff33   ,
73      0x0259,   ((0x00 << 8)   |  0x02),   0xff36   ,
74      0x025b,   ((0x00 << 8)   |  0x02),   0xff35   ,
75      0x0260,   ((0x00 << 8)   |  0x05),   0xff33   ,
76      0x0263,   ((0x00 << 8)   |  0x03),   0xff31   ,
77      0x0268,   ((0x00 << 8)   |  0x05),   0xff2f   ,
78      0x0269,   ((0x06 << 8)   |  0x06),   0xff2d   ,
79      0x0272,   ((0x00 << 8)   |  0x03),   0xff2b   ,
80      0x0275,   ((0x00 << 8)   |  0x03),   0xff2a   ,
81      0x0280,   ((0x03 << 8)   |  0x03),   0xff26   ,
82      0x0288,   ((0x00 << 8)   |  0x05),   0xff26   ,
83      0x028a,   ((0x01 << 8)   |  0x01),   0xff27   ,
84      0x0292,   ((0x00 << 8)   |  0x07),   0xff25   ,
85      0x0345,   ((0x00 << 8)   |  0xb3),   0x0054   ,
86      0x03ac,   ((0x00 << 8)   |  0x67),   0xffda   ,
87      0x03ad,   ((0x02 << 8)   |  0x01),   0xffdb   ,
88      0x03b1,   ((0x10 << 8)   |  0x01),   0xffe0   ,
89      0x03c2,   ((0x00 << 8)   |  0x01),   0xffe1   ,
90      0x03c3,   ((0x08 << 8)   |  0x01),   0xffe0   ,
91      0x03cc,   ((0x00 << 8)   |  0x01),   0xffc0   ,
92      0x03cd,   ((0x01 << 8)   |  0x01),   0xffc1   ,
93      0x03d0,   ((0x00 << 8)   |  0x02),   0xffc2   ,
94      0x03d1,   ((0x00 << 8)   |  0x01),   0xffc7   ,
95      0x03d5,   ((0x00 << 8)   |  0x04),   0xffd1   ,
96      0x03d6,   ((0x00 << 8)   |  0x01),   0xffca   ,
97      0x03e3,   ((0x0c << 8)   |  0x02),   0xffff   ,
98      0x03f0,   ((0x00 << 8)   |  0x01),   0xffaa   ,
```

TABLE 5-continued casetable.h

```
 99     0x03f1,  ( (0x00 << 8)  |  0x01),   0xffb0  ,
100     0x03f2,  ( (0x00 << 8)  |  0x01),   0xffb1  ,
101     0x0430,  ( (0x1f << 8)  |  0x01),   0xffe0  ,
102     0x0451,  ( (0x0b << 8)  |  0x01),   0xffb0  ,
103     0x045e,  ( (0x01 << 8)  |  0x01),   0xffb0  ,
104     0x0461,  ( (0x20 << 8)  |  0x02),   0xffff  ,
105     0x0491,  ( (0x2e << 8)  |  0x02),   0xffff  ,
106     0x04c2,  ( (0x02 << 8)  |  0x02),   0xffff  ,
107     0x04c8,  ( (0x04 << 8)  |  0x04),   0xffff  ,
108     0x04d1,  ( (0x1a << 8)  |  0x02),   0xffff  ,
109     0x04ef,  ( (0x06 << 8)  |  0x02),   0xffff  ,
110     0x04f9,  ( (0x00 << 8)  |  0x04),   0xffff  ,
111     0x0561,  ( (0x25 << 8)  |  0x01),   0xffd0  ,
112     0x1e01,  ( (0x94 << 8)  |  0x02),   0xffff  ,
113     0x1e9b,  ( (0x00 << 8)  |  0x06),   0xffc5  ,
114     0x1ea1,  ( (0x58 << 8)  |  0x02),   0xffff  ,
115     0x1f00,  ( (0x07 << 8)  |  0x01),   0x0008  ,
116     0x1f10,  ( (0x05 << 8)  |  0x01),   0x0008  ,
117     0x1f20,  ( (0x07 << 8)  |  0x01),   0x0008  ,
118     0x1f30,  ( (0x07 << 8)  |  0x01),   0x0008  ,
119     0x1f40,  ( (0x05 << 8)  |  0x01),   0x0008  ,
120     0x1f51,  ( (0x06 << 8)  |  0x02),   0x0008  ,
121     0x1f60,  ( (0x07 << 8)  |  0x01),   0x0008  ,
122     0x1f70,  ( (0x01 << 8)  |  0x01),   0x004a  ,
123     0x1f72,  ( (0x03 << 8)  |  0x01),   0x0056  ,
124     0x1f76,  ( (0x01 << 8)  |  0x01),   0x0064  ,
125     0x1f78,  ( (0x01 << 8)  |  0x01),   0x0080  ,
126     0x1f7a,  ( (0x01 << 8)  |  0x01),   0x0070  ,
127     0x1f7c,  ( (0x01 << 8)  |  0x01),   0x007e  ,
128     0x1f80,  ( (0x07 << 8)  |  0x01),   0x0008  ,
129     0x1f90,  ( (0x07 << 8)  |  0x01),   0x0008  ,
130     0x1fa0,  ( (0x07 << 8)  |  0x01),   0x0008  ,
131     0x1fb0,  ( (0x01 << 8)  |  0x01),   0x0008  ,
132     0x1fb3,  ( (0x00 << 8)  |  0x02),   0x0009  ,
133     0x1fbe,  ( (0x00 << 8)  |  0x0b),   0xe3db  ,
134     0x1fc3,  ( (0x00 << 8)  |  0x05),   0x0009  ,
135     0x1fd0,  ( (0x01 << 8)  |  0x01),   0x0008  ,
136     0x1fe0,  ( (0x01 << 8)  |  0x01),   0x0008  ,
137     0x1fe5,  ( (0x00 << 8)  |  0x04),   0x0007  ,
138     0x1ff3,  ( (0x00 << 8)  |  0x0e),   0x0009  ,
139     0x2170,  ( (0x0f << 8)  |  0x01),   0xfff0  ,
140     0x24d0,  ( (0x19 << 8)  |  0x01),   0xffe6  ,
141     0xff41,  ( (0x19 << 8)  |  0x01),   0xffe0  ,
142 };
143
144 static PRUint32 gToUpperItems = 103;
145
146 static pRUint16 gToLower[ ] =
147 { /* From    To           Every  Diff    */
148     0x0041,  ( (0x19 << 8)  |  0x01),   0x0020  ,
149     0x00c0,  ( (0x16 << 8)  |  0x01),   0x0020  ,
150     0x00d8,  ( (0x06 << 8)  |  0x01),   0x0020  ,
151     0x0100,  ( (0x2e << 8)  |  0x02),   0x0001  ,
152     0x0130,  ( (0x00 << 8)  |  0x00),   0xff39  ,
153     0x0132,  ( (0x04 << 8)  |  0x02),   0x0001  ,
154     0x0139,  ( (0x0e << 8)  |  0x02),   0x0001  ,
155     0x014a,  ( (0x2c << 8)  |  0x02),   0x0001  ,
156     0x0178,  ( (0x00 << 8)  |  0x00),   0xff87  ,
157     0x0179,  ( (0x04 << 8)  |  0x02),   0x0001  ,
158     0x0181,  ( (0x00 << 8)  |  0x00),   0x00d2  ,
159     0x0182,  ( (0x02 << 8)  |  0x02),   0x0001  ,
160     0x0186,  ( (0x00 << 8)  |  0x00),   0x00ce  ,
161     0x0187,  ( (0x00 << 8)  |  0x00),   0x0001  ,
162     0x0189,  ( (0x01 << 8)  |  0x01),   0x00cd  ,
163     0x018b,  ( (0x00 << 8)  |  0x00),   0x0001  ,
164     0x018e,  ( (0x00 << 8)  |  0x00),   0x004f  ,
165     0x018f,  ( (0x00 << 8)  |  0x00),   0x00ca  ,
166     0x0190,  ( (0x00 << 8)  |  0x00),   0x00cb  ,
167     0x0191,  ( (0x00 << 8)  |  0x00),   0x0001  ,
168     0x0193,  ( (0x00 << 8)  |  0x00),   0x00cd  ,
169     0x0194,  ( (0x00 << 8)  |  0x00),   0x00cf  ,
170     0x0196,  ( (0x00 << 8)  |  0x00),   0x00d3  ,
171     0x0197,  ( (0x00 << 8)  |  0x0d),   0x00d1  ,
172     0x0198,  ( (0x00 << 8)  |  0x00),   0x0001  ,
173     0x019c,  ( (0x00 << 8)  |  0x00),   0x00d3  ,
174     0x019d,  ( (0x00 << 8)  |  0x00),   0x00d5  ,
175     0x019f,  ( (0x00 << 8)  |  0x00),   0x00d6  ,
```

TABLE 5-continued casetable.h

```
176     0x01a0,  ( (0x04 << 8)  | 0x02),   0x0001  ,
177     0x01a6,  ( (0x00 << 8)  | 0x00),   0x00da  ,
178     0x01a7,  ( (0x00 << 8)  | 0x00),   0x0001  ,
179     0x01a9,  ( (0x00 << 8)  | 0x00),   0x00da  ,
180     0x01ac,  ( (0x00 << 8)  | 0x00),   0x0001  ,
181     0x01ae,  ( (0x00 << 8)  | 0x00),   0x00da  ,
182     0x01af,  ( (0x00 << 8)  | 0x00),   0x0001  ,
183     0x01b1,  ( (0x01 << 8)  | 0x01),   0x00d9  ,
184     0x01b3,  ( (0x02 << 8)  | 0x02),   0x0001  ,
185     0x01b7,  ( (0x00 << 8)  | 0x00),   0x00db  ,
186     0x01b8,  ( (0x04 << 8)  | 0x04),   0x0001  ,
187     0x01c4,  ( (0x00 << 8)  | 0x00),   0x0002  ,
188     0x01c5,  ( (0x00 << 8)  | 0x00),   0x0001  ,
189     0x01c7,  ( (0x00 << 8)  | 0x00),   0x0002  ,
190     0x01c8,  ( (0x00 << 8)  | 0x00),   0x0001  ,
191     0x01ca,  ( (0x00 << 8)  | 0x00),   0x0002  ,
192     0x01cb,  ( (0x10 << 8)  | 0x02),   0x0001  ,
193     0x01de,  ( (0x10 << 8)  | 0x02),   0x0001  ,
194     0x01f1,  ( (0x00 << 8)  | 0x00),   0x0002  ,
195     0x01f2,  ( (0x02 << 8)  | 0x02),   0x0001  ,
196     0x01fa,  ( (0x1c << 8)  | 0x02),   0x0001  ,
197     0x0386,  ( (0x00 << 8)  | 0x00),   0x0026  ,
198     0x0388,  ( (0x02 << 8)  | 0x01),   0x0025  ,
199     0x038c,  ( (0x00 << 8)  | 0x00),   0x0040  ,
200     0x038e,  ( (0x01 << 8)  | 0x01),   0x003f  ,
201     0x0391,  ( (0x10 << 8)  | 0x01),   0x0020  ,
202     0x03a3,  ( (0x08 << 8)  | 0x01),   0x0020  ,
203     0x03e2,  ( (0x0c << 8)  | 0x02),   0x0001  ,
204     0x0401,  ( (0x0b << 8)  | 0x01),   0x0050  ,
205     0x040e,  ( (0x01 << 8)  | 0x01),   0x0050  ,
206     0x0410,  ( (0x1f << 8)  | 0x01),   0x0020  ,
207     0x0460,  ( (0x20 << 8)  | 0x02),   0x0001  ,
208     0x0490,  ( (0x2e << 8)  | 0x02),   0x0001  ,
209     0x04c1,  ( (0x02 << 8)  | 0x02),   0x0001  ,
210     0x04c7,  ( (0x04 << 8)  | 0x04),   0x0001  ,
211     0x04d0,  ( (0x1a << 8)  | 0x02),   0x0001  ,
212     0x04ee,  ( (0x06 << 8)  | 0x02),   0x0001  ,
213     0x04f8,  ( (0x00 << 8)  | 0x00),   0x0001  ,
214     0x0531,  ( (0x25 << 8)  | 0x01),   0x0030  ,
215     0x10a0,  ( (0x25 << 8)  | 0x01),   0x0030  ,
216     0x1e00,  ( (0x94 << 8)  | 0x02),   0x0001  ,
217     0x1ea0,  ( (0x58 << 8)  | 0x02),   0x0001  ,
218     0x1f08,  ( (0x07 << 8)  | 0x01),   0xfff8  ,
219     0x1f18,  ( (0x05 << 8)  | 0x01),   0xfff8  ,
220     0x1f28,  ( (0x07 << 8)  | 0x01),   0xfff8  ,
221     0x1f38,  ( (0x07 << 8)  | 0x01),   0xfff8  ,
222     0x1f48,  ( (0x05 << 8)  | 0x01),   0xfff8  ,
223     0x1f59,  ( (0x06 << 8)  | 0x02),   0xfff8  ,
224     0x1f68,  ( (0x07 << 8)  | 0x01),   0xfff8  ,
225     0x1f88,  ( (0x07 << 8)  | 0x01),   0xfff8  ,
226     0x1f98,  ( (0x07 << 8)  | 0x01),   0xfff8  ,
227     0x1fa8,  ( (0x07 << 8)  | 0x01),   0xfff8  ,
228     0x1fb8,  ( (0x01 << 8)  | 0x01),   0xfff8  ,
229     0x1fba,  ( (0x01 << 8)  | 0x01),   0xffb6  ,
230     0x1fbc,  ( (0x00 << 8)  | 0x00),   0xfff7  ,
231     0x1fc8,  ( (0x03 << 8)  | 0x01),   0xffaa  ,
232     0x1fcc,  ( (0x00 << 8)  | 0x00),   0xfff7  ,
233     0x1fd8,  ( (0x01 << 8)  | 0x01),   0xfff8  ,
234     0x1fda,  ( (0x01 << 8)  | 0x01),   0xff9c  ,
235     0x1fe8,  ( (0x01 << 8)  | 0x01),   0xfff8  ,
236     0x1fea,  ( (0x01 << 8)  | 0x01),   0xff90  ,
237     0x1fec,  ( (0x00 << 8)  | 0x00),   0xfff9  ,
238     0x1ff8,  ( (0x01 << 8)  | 0x01),   0xff80  ,
239     0x1ffa,  ( (0x01 << 8)  | 0x01),   0xff82  ,
240     0x1ffc,  ( (0x00 << 8)  | 0x00),   0xfff7  ,
241     0x2160,  ( (0x0f << 8)  | 0x01),   0x0010  ,
242     0x24b6,  ( (0x19 << 8)  | 0x01),   0x001a  ,
243     0xff21,  ( (0x19 << 8)  | 0x01),   0x0020
244 };
245
246 static PRUint32 gToLowerItems = 96;
247
248
```

The gencasetable.pl generates three 16 bit arrays: one array for upper case mapping, one array for lower case mapping, and the third array for upper to title case mapping. Because the number of difference between upper case and title case is fairly small at present (four for Unicode 3.0), the "List of mapping pair" is used to encode this pair. The ToTitle operation is an additional sequential search of this list after applying the ToUpper operation to the input character.

Result

Table 6 below shows the size of the table which holds the case mapping information.

TABLE 6

Size of Case Mapping Table

| Version of Unicode | Version and date of UnicodeData-Latest.txt file | To Upper Table | To Lower Table | Upper To Title Table | Total |
|---|---|---|---|---|---|
| Unicode 2.1 | 2.1.8/Dec. 29 22:05:00 1998 | 103 × 6 = 618 bytes | 96 × 6 = 576 bytes | 4 × 4 = 16 bytes | 1210 bytes |
| Unicode 3.0 | 3.0.0/Fri Sep. 10 19:36:00 1999 | 107 × 6 = 642 bytes | 99 × 6 = 594 bytes | 4 × 4 = 16 bytes | 1252 bytes |

The data above show that the size of table is about:

0.47% used by the Flat Array approach [262,144 bytes];

11% used by the Indirect Array approach [11,264 bytes];

22.4% used by the List of mapping pair approach [5,592 bytes]; and 22.2% [or 7.41% ] of the ICU's Compact Array approach [5,632 bytes or 16,890 bytes].

Figure 6:
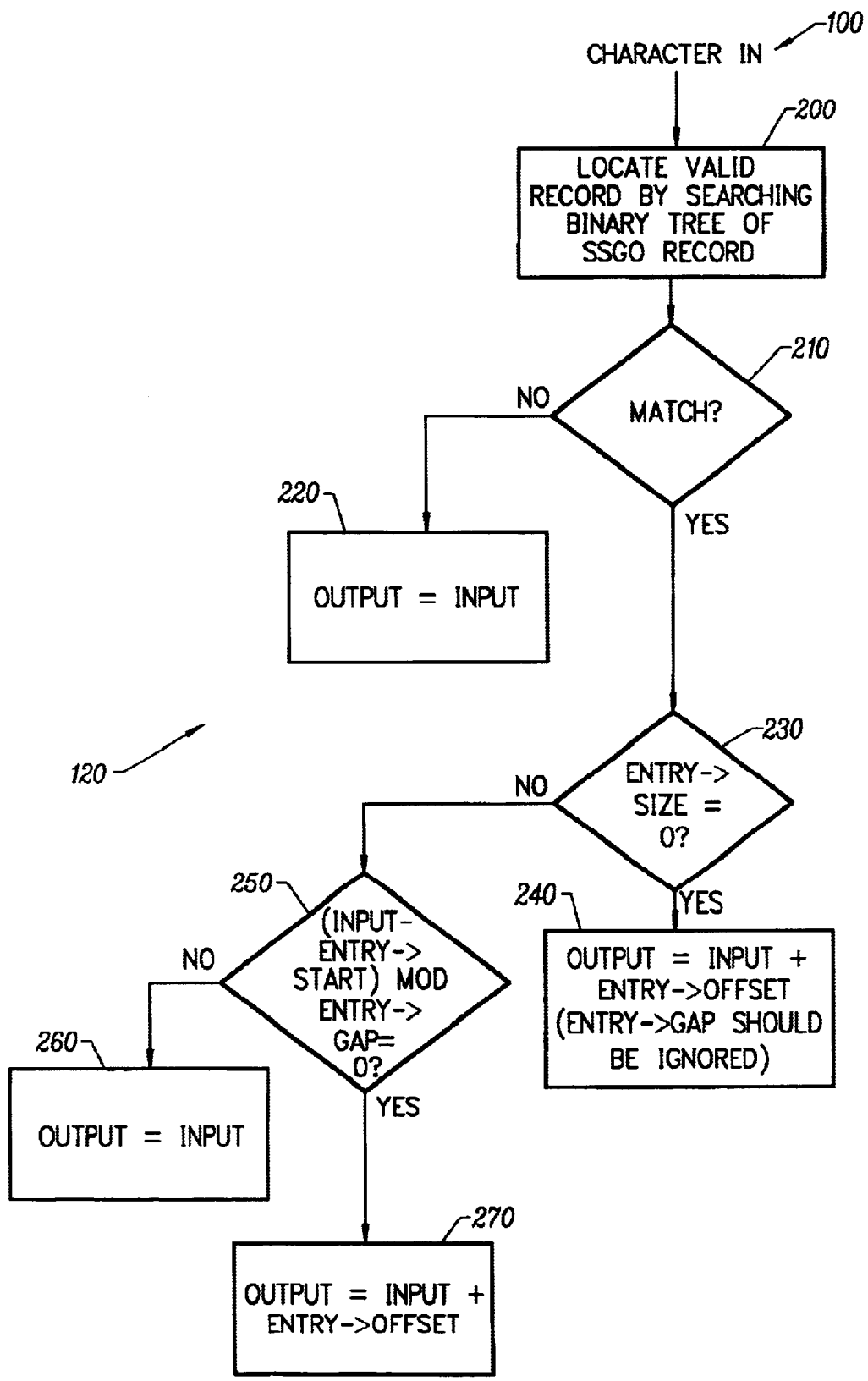
FIG. 6 is a flow diagram of a binary tree of SSGO record algorithm according to the invention.

FIG. 6 is a flow diagram of a binary tree of SSGO record algorithm according to the invention. The following procedures are used to access the case information from the compressed SSGO array:

1. Locate the valid record by searching the binary tree of SSGO record which ((entry->start<=input) && (input<=(entry->start+entry->size)).(200).
2. If no record match (210), return output=input (220).
3. If entry->size equal to 0 (230), return output=input+entry->offset (entry->gap should be ignored if entry->size equal to 0) (240).
4. If (input−entry->start) mod entry->gap equal to 0 (250), return output=input+entry->offset (270).
5. Otherwise, return output=input (260).

Currently, for Unicode 3.0, there are 107 nodes in the binary tree for an upper case mapping (the lower case mapping has 99 nodes). The depth of the binary tree is six or seven because $2^6<107<2^7$. Two or three comparisons are needed in each level of the tree. Therefore, for those characters which have case information, between 12 to 21 comparisons are needed to locate the valid record. Also, two more comparisons are needed for steps 3 and 4 above. Therefore, the total number of comparisons is between 14 and 23.

Optimize The Speed

Problem

The speed of table lookup is slow. It is necessary to optimize the performance for this operation.

Solution

Figure 7:
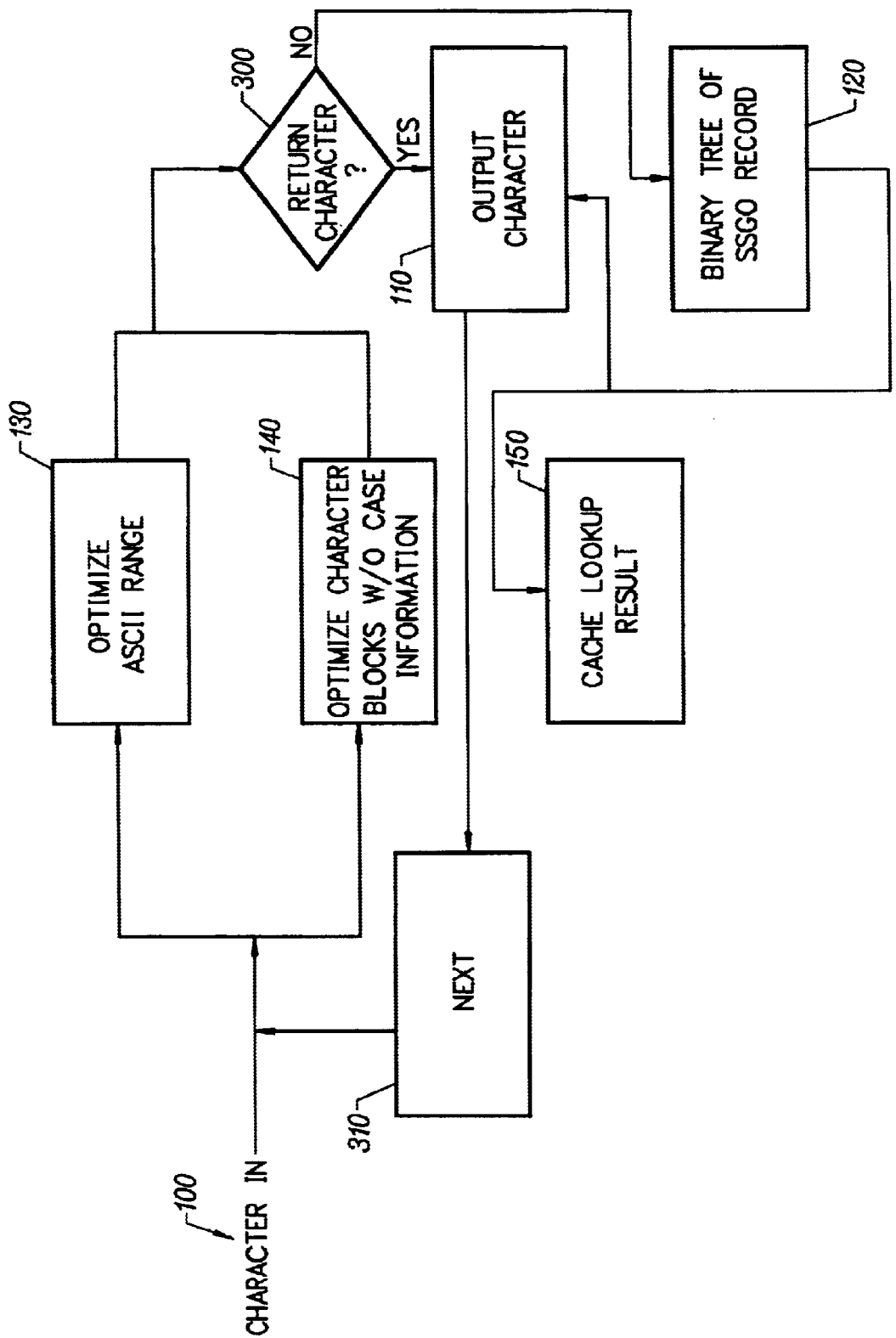
FIG. 7 is a flow diagram of a method and apparatus using a list of <minimum, size, gap, offset> quadruple to encode Unicode characters in an upper/lower case character mapping according to the invention.

FIG. 7 is a flow diagram of a method and apparatus using a list of <minimum, size, gap, offset> quadruple to encode Unicode characters in an upper/lower case character mapping according to the invention. In the preferred embodiment of the invention, a three optimization strategy is used as follows:

1. Optimization—the ASCII range (130).
2. Optimization—character blocks which do not have case information (140).
3. Optimization—cache the table lookup result (150).

The result of the ASCII range optimization (300) and character block without case information optimization (140) either returns a character(110), in which case a next character (310) is processed, or the character is looked up for a case match using the binary tree of SSGO record technique

Optimization 1—US-ASCII Range

Context

US-ASCII data are used more frequently than any other characters in the Unicode. All of the HTML tags are in the US-ASCII range. All, charset names are in US-ASCII. All of the MME/RFC822 header names, not the values, are in US-ASCII. All of this information requires a case insensitive comparison and thus needs case information. Therefore, the performance of case conversion for US-ASCII range must be very fast.

Problem

The input data could be any Unicode which case map to one Unicode. The table lookup algorithm for this compact table is too slow for ASCII.

Solution

Figure 8:
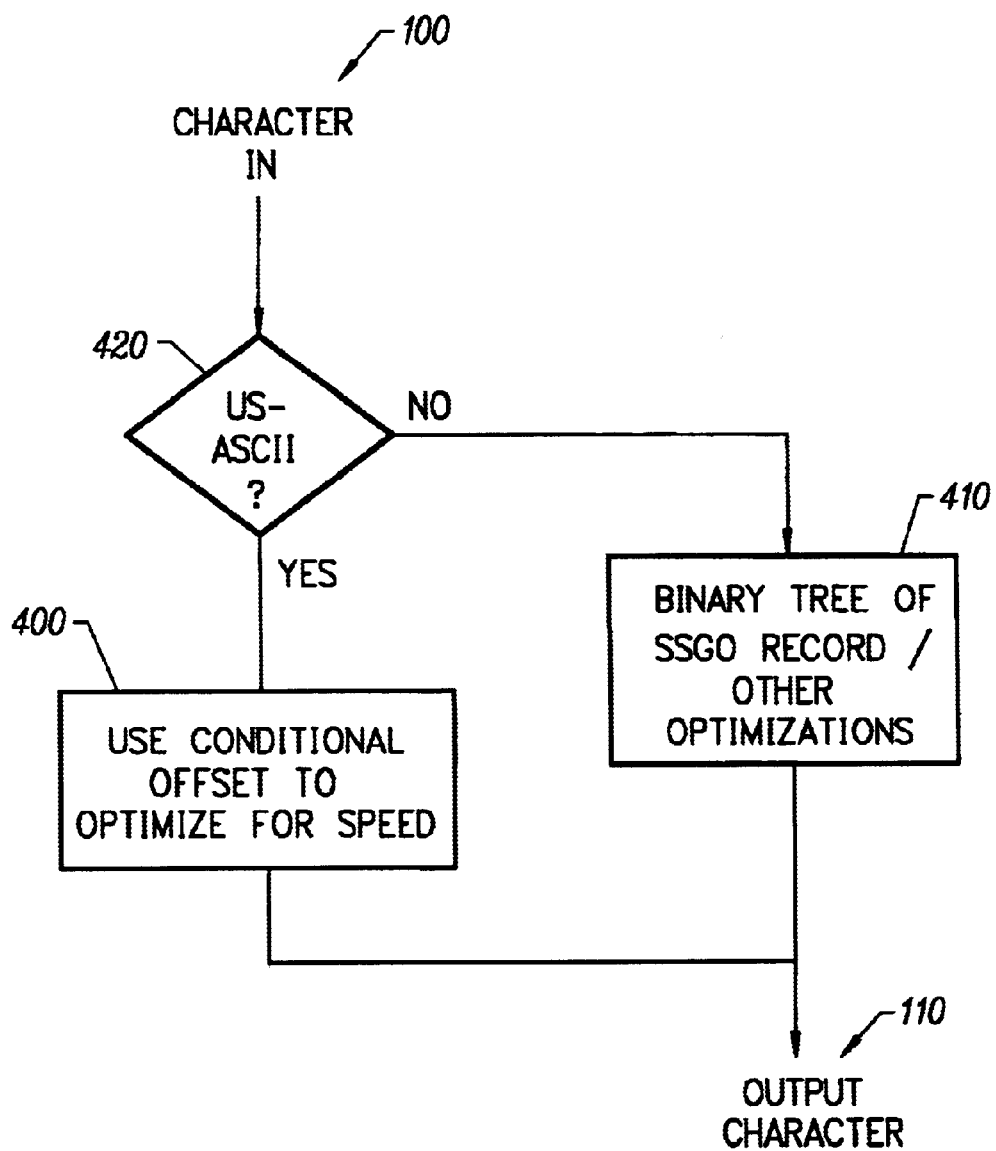
FIG. 8 is a flow diagram of an optimization on ASCII range characters according to the invention.

FIG. 8 is a flow diagram of an optimization on ASCII range characters according to the invention. This optimization performs special handling for US-ASCII. Before using the lookup table, check the input (420) to see the character is US-ASCII or not. If the character is US-ASCII (410), use the conditional offset method to optimize the speed.

```
if (IS_ASCII (input) )
{
    if (IS_ASCII_LOWER (input) )
        output = input − 0x0020;
    else
        output = input;
    return output;
{
// the usual code . . .
```

If the character is not US-ASCII, use the lookup table (410).

Result

This approach reduces the number of comparisons for the ASCII range down to between one and three comparisons. However, this approach increases the number of comparisons for other characters by one comparison.

Optimization 2—Character blocks which do not have case information

Problem

Only 2.4225% (1398/57709) of the total Unicode 3.0 allocated characters have a different case. It is necessary to make sure the performance of the rest of the 97.5775% characters do not slow down by the table lookup process.

Solution

Figure 9:
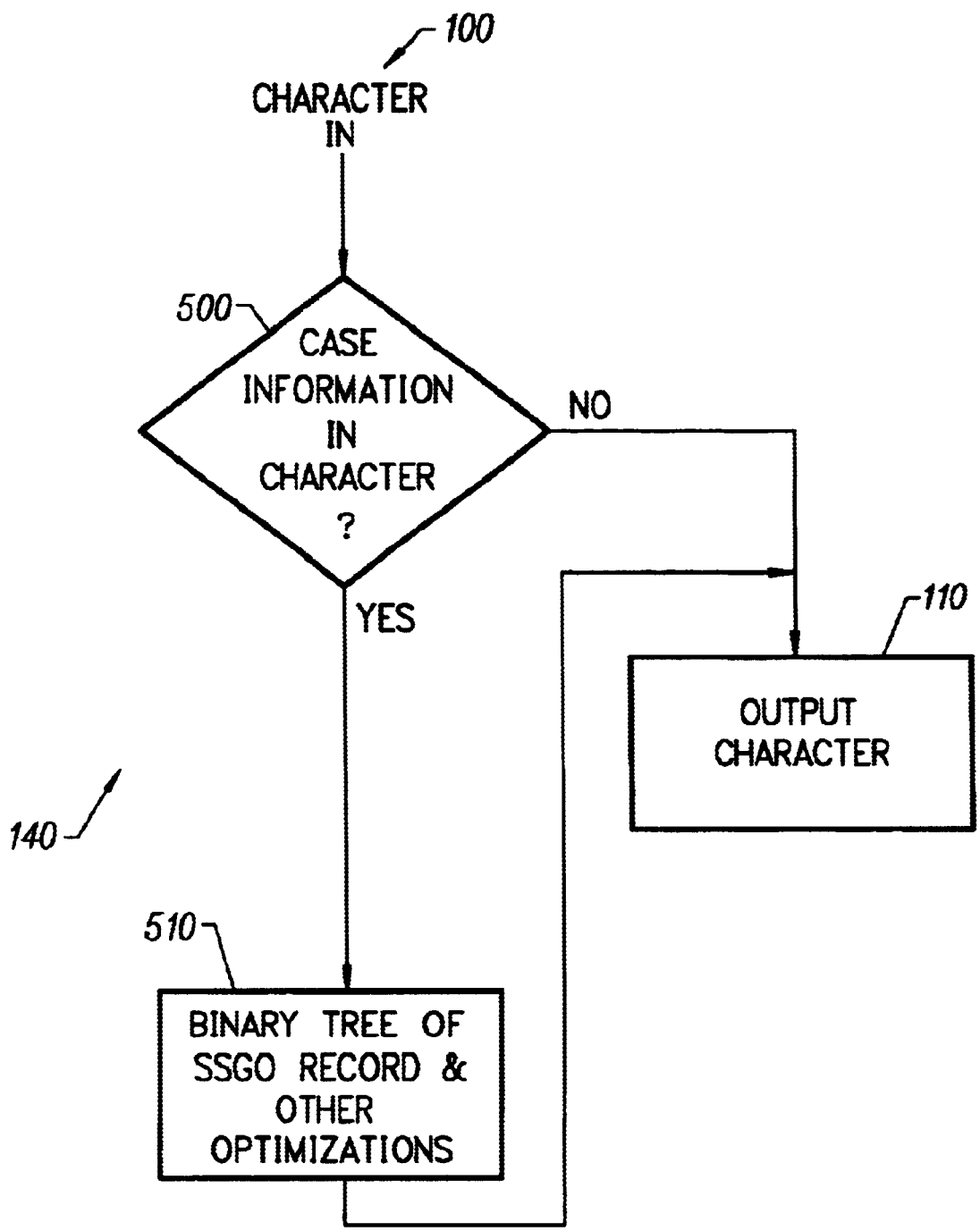
FIG. 9 is a flow diagram of an optimization on character block without case information according to the invention.

FIG. 9 is a flow diagram of an optimization on character block without case information according to the invention. From the study of case character distribution mentioned above, it is known that the case characters are currently: only distributed under eleven blocks. Actually, these eleven blocks form only five continuous regions. The character is examined to determine if it has a case (500). Therefore, it is only necessary to perform case mapping (510) for those characters within these five regions. Note that this optimization is only valid for Unicode 3.0 and prior versions thereof.

```
// . . . after ASCII optimization
    if ( ( ( (0x2500 <= input) && ( input <= 0xFEFF) ) ||
          ( (0x0600 <= input) && ( input <= 0x1DFF) ) ||
          ( (0x2000 <= input) && ( input <= 0x20FF) ) ||
          ( (0x2200 <= input) && ( input <= 0x23FF) )
        )
    {
        return output;
    }
    // the table lookup code . . .
```

Result

This approach slows down the performance for those characters which have a different case. However, this optimization minimizes the performance impact on characters which do not have different case.

Optimization 3—Cache the table lookup result

Context

It is known that a single user (or a single user group) usually uses one or two languages. It is also known that there is a relatively small total number of characters for those written systems which have case characters.

Problem

The performance for characters which need table lookup is slow. It is necessary to improve the lookup performance.

Solution

Figure 10:
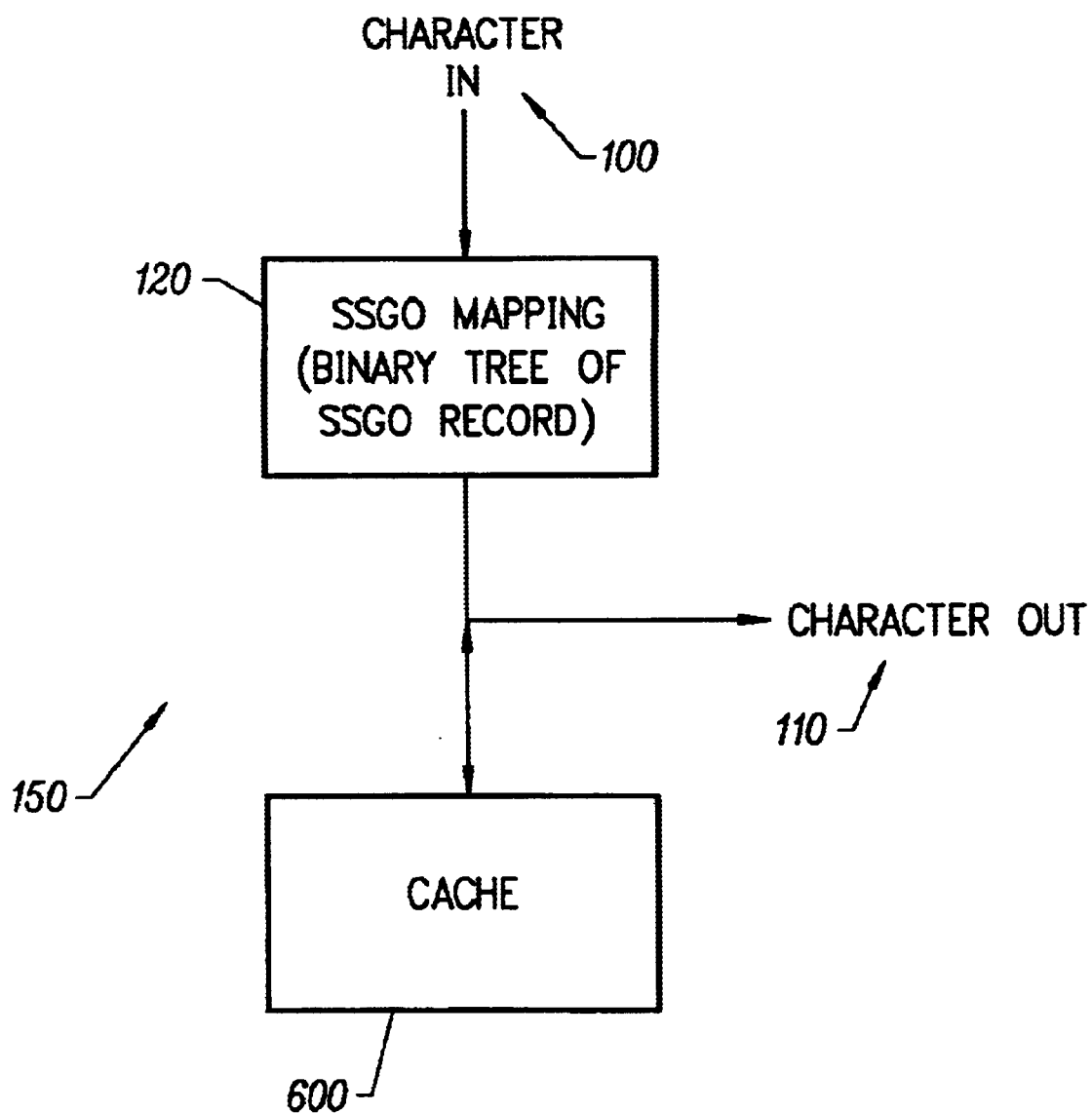
FIG. 10 is a block schematic diagram of a cache for optimizing a binary tree of SSGO record result according to the invention.

FIG. 10 is a block schematic diagram of a cache for optimizing a binary tree of SSGO record result according to the invention. This aspect of the invention adds a cache (600) for this operation. Because the total number of characters which need to be perform case mapping for a single user (or user group) are limited, it is possible to define a reasonable size for a simple cache to cache the table lookup result. See Table 7 below for the cache code.

Possible inputs to the cache:
  No ASCII;
  Characters in the blocks which have case characters;
  Characters used in one or two languages;
  Maximum possible input is 2,261 characters, but most language which have case characters have small number of alphabetic characters.
  Size of Cache: 64 bytes.
  Hash function—lower six bits of the input characters.
  Multi-thread: Take care by atomic 32-bit data accessing offered by most CPU today, use of local variable and the store the last hit cache algorithm.

TABLE 7

The Cache Code

```
// . . . after the no case characters optimization
    // Access the cache, read the whole 32 bits
together into local variable so we won't need to
    // worry about race condition from other threads
    PRUint32 cachedData = Cache[input &
CASE_MAP_CACHE_MASK];
    // if the high 16 bits equal the input, we hit and simple return
the lower 16 bits
    if(input == ( (cachedData >> 16) & 0x0000FFFF))
        return (cachedData & 0x0000FFFF);
    // Table lookup code . . .
    output = TableLookup(input);
    // Put the input and output into the cache, put the 32 bits
```

TABLE 7-continued

The Cache Code

```
into it at once so we won't need
    // to worry about other the race condition from other threads
    Cache[input & CASE_MAP_CACHE_MASK] =
( ( (input << 16) & 0xFFFF0000) | (0x0000FFFF & output));
    return output;
```

Result

This process slows down the process if a character is not hit and increases the required memory. The total required memory is eight times the size of the cache in bytes. For example, if the size of the cache is 64 bytes, the size of each element is 32 bits, which is four bytes. One cache is need for upper case and one cache is needed for lower case. Thus, the required memory is 2×4×64=512 bytes.

Comparison of Algorithms

Table 8 below provides a comparison of the various prior art algorithms to that of the subject invention.

TABLE 8

Comparison of Algorithms

| | Required Memory | Performance |
|---|---|---|
| Conditional Offset | N/A | N/A |
| Flat Array | 262,144 | Fast: 1 array access |
| Indirect Array | 11,264 | Slower: 1–2 array access + 1 comparison |
| List of Mapping Pair | 5,592 | Slower: 10~11 comparison |
| Compact Array (based on ICU-1.3.1) | 5,632 | Equal to Indirect Array |
| SSGO Binary Tree | 1,252 | Slower: 14~23 comparisons |
| SSGO + ASCII optimization | 1,264 | ASCII: 2~3 comparisons and 1 ADD; Non ASCII: 15~24 comparisons |
| SSGO + No-Case optimization | 1,296 | ASCII: same as above; Blocks do not have case characters: 3~9 comparisons; Others: Slower 23~32 comparison |
| SSGO + cache (size = 64) | 1,808 | ASCII & Blocks do not have case characters: same as above; Hit cache: 1 ARRAY ACCESS, 3 AND, 1 SHIFT AND 1 comparison; Miss cache: 1 ARRAY ACCESS, 5 AND, 1 OR, 2 SHIFT and 1 comparison in additional to the 23~32 comparison in the table lookup |

Table 9 below shows a sample C++ implementation of the case conversion algorithm described herein. Notice that is it not necessary to lock the cache, even in a multi-thread environment because the invention gets and sets both the key and value of the cache in a 32-bit atomic operation which is supported by most CPU today. Also, because it is only necessary to cache the last hit value, instead of most-frequent-use value or first-hit value. This simplifies the cache code and therefore ensures the performance of the cache code.

TABLE 9 mozilla/intl/unicharutil/src/nsCaseConversionImp2.cpp
CVS Log
CVS

```
 1 /* -*- Mode: C; tab-width: 4; indent-tabs-mode: nil; c-basic-offset: 2 -*-
 2 *
 3 * The contents of this file are subject to the Netscape Public
 4 * License Version 1.1 (the "License"); you may not use this file
 5 * except in compliance with the License. You may obtain a copy of
 6 * the License at http://www.mozilla.org/NPL/
 7 *
 8 * Software distributed under the License is distributed on an "AS
 9 * IS" basis, WITHOUT WARRANTY OF ANY KIND, either express or
10 * implied. See the License for the specific language governing
11 * rights and limitations under the License.
12 *
13 * The Original Code is mozilla.org code.
14 *
15 * The Initial Developer of the Original Code is Netscape
16 * Communications Corporation. Portions created by Netscape are
17 * Copyright (C) 1999 Netscape Communications Corporation. All
18 * Rights Reserved.
19 *
20 * Contributor(s):
21 */
22
23 #include "pratom.h"
24 #include "nsUUDll.h"
25 #include "nsCaseConversionImp2.h"
26 #include "casetable.h"
27
28
29 // For gUpperToTitle
30 enum {
31      kUpperIdx =0,
32      kTitleIdx
33 };
34
35 // For gUpperToTitle
36 enum {
37      kLowIdx =0,
38      kSizeEveryIdx,
39      kDiffIdx
40 };
41
42 #define IS_ASCII(u) (0x0000 == ((u) & 0xFF80))
43 #define IS_ASCII_UPPER(u) ((0x0041 <= (u)) && ( (u) <= 0x005a))
44 #define IS_ASCII_LOWER(u) ((0x0061 <= (u)) && ( (u) <= 0x007a))
45 #define IS_ASCII_ALPHA(u) (IS_ASCII_UPPER(u) || IS_ASCII_LOWER(u))
46 #define IS_ASCII_SPACE(u) (0x0020 == (u) )
47
48 #define IS_NOCASE_CHAR(u) /
49      (((0x2500 <= (u)) && ((u) <= 0xFEFF)) || \
50      ((0x0600 <= (u)) && ( (u) <= 0x0FFF)) || \
51      ((0x1100 <= (u)) && ( (u) <= 0x1DFF)) || \
52      ((0x2000 <= (u)) && ( (u) <= 0x20FF)) || \
53      ((0x2200 <= (u)) && ( (u) <= 0x23FF)))
54
55 // Size of Tables
56
57
58 #define CASE_MAP_CACHE_SIZE 0x40
59 #define CASE_MAP_CACHE_MASK 0x3F
60
61 class nsCompressedMap {
62 public:
63      nsCompressedMap(PRUnichar *aTable, PRUint32 aSize);
64      ~nsCompressedMap();
65      PRUnichar Map(PRUnichar aChar);
66 protected:
67        PRUnichar Lookup(PRUint32 I, PRUint32 m, PRUint32 r, PRUnichar aChar);
68
69 private:
70      PRUnichar *mTable;
71      PRUint32 mSize;
72      PRUint32 *mCache;
73 };
74
75 nsCompressedMap ::nsCompressedMap(PRUnichar *aTable, PRUint32 aSize)
76 {
```

TABLE 9-continued

```
77      mTable = aTable;
78      mSize = aSize;
79      mCache = new PRUint32[CASE_MAP_CACHE_SIZE];
80      for(int i = 0; i < CASE_MAP_CACHE_SIZE; i++)
81          mCache[i] = 0;
82  }
83
84  nsCompressedMap::~nsCompressedMap()
85  {
86      delete[] mCache;
87  }
88
89  PRUnichar nsCompressedMap::Map(PRUnichar aChar)
90  {
91      // no need to worry thread since cached value are
92      // not object but primitive data type which could be
93      // accessed in atomic operation. We need to access
94      // the whole 32 bit of cachedData at once in order to make it
95      // thread safe. Never access bits from mCache dirrectly
96
97      PRUint32 cachedData = mCache[aChar & CASE_MAP_CACHE_MASK];
98      if(aChar == ((cachedData >> 16) & 0x0000FFFF))
99          return (cachedData & 0x0000FFFF);
100
101     PRUnichar res = this->Lookup(0, (mSize/2), mSize-1, aChar);
102
103     mCache[aChar & CASE_MAP_CACHE_MASK) =
104         (((aChar << 16) & 0xFFFF0000) | (0x0000FFFF & res));
105     return res;
106 }
107
108 PRUnichar nsCompressedMap::Lookup(
109     PRUint32 l, PRUint32 m, PRUint32 r, PRUnichar aChar)
110 {
111     if (aChar > ((mTable[(m*3)+kSizeEveryIdx] >> 8) +
112                 mTable[(m*3)+kLowIdx]))
113     {
114         if(l > m)
115             return aChar;
116         PRUint32 newm = (m+r+1)/2;
117         if(newm == m)
118             newm++;
119         return this->Lookup(m+1, newm , r, aChar);
120
121     } else if ( mTable[(m*3)+kLowIdx] > aChar) {
122         if(r < m)
123             return aChar;
124         PRUint32 newm = (l+m-1)/2;
125         if(newm == m)
126             newm++;
127         return this->Lookup(l, newm, m-1, aChar);
128
129     } else {
130         if(((Table[(m*3)+kSizeEveryIdx] & 0x00FF) > 0) &&
131             (0 != ((aChar - mTable[(m*3)+kLowIdx]) %
132                 (Table[(m*3)+kSizeEveryIdx] & 0x00FF))))
133         {
134             return aChar;
135         }
136         return aChar + mTable[(m*3)+kDiffIdx];
137     }
138 }
139
140 NS_DEFINE_IID(kCaseConversionIID, NS_ICASECONVERSION_IID);
141
142 nsrefcnt nsCaseConversionImp2::gInit = 0;
143
144 NS_IMPL_ISUPPORTS(nsCaseConversionImp2, kCaseConversionIID);
145
146 static nsCompressedMap *gUpperMap = nsnull;
147 static nsCompressedMap *gLowerMap = nsnull;
148
149 nsresult nsCaseConversionImp2::ToUpper(
150     PRUnichar aChar, PRUnichar* aReturn
151 )
152 {
153     if( IS_ASCII(aChar)) // optimize for ASCII
154     {
155         if(IS_ASCII_LOWER(aChar))
```

TABLE 9-continued

```
156              *aReturn = aChar - 0x0020;
157         else
158              *aReturn = aChar;
159      }
160      else if(IS_NOCASE_CHAR(aChar)) // optimize for block which have no case
161      {
162         *aReturn = aChar;
163      }
164      else
165      {
166         *aReturn = gUpperMap->Map(aChar);
167      }
168      return NS_OK;
169 }
170
171 nsresult nsCaseConversionImp2::ToLower(
172     PRUnichar aChar, PRUnichar* aReturn
173 )
174 {
175     if(IS_ASCII(aChar)) // optimize for ASCII
176     {
177         if(IS_ASCII_UPPER(aChar))
178              *aReturn = aChar + 0x0020;
179         else
180              *aReturn = aChar;
181     }
182     else if(IS_NOCASE_CHAR(aChar)) // optimize for block which have no case
183     {
184         *aReturn = aChar;
185     }
186     else
187     {
188         *aReturn = gLowerMap->Map(aChar);
189     }
190     return NS_OK;
191 }
192
193 nsresult nsCaseConversionImp2::ToTitle(
194     PRUnichar aChar, PRUnichar* aReturn
195 )
196 {
197     if(IS_ASCII(aChar)) // optimize for ASCII
198     {
199         return this->ToUpper(aChar, aReturn);
200     }
201     else if(IS_NOCASE_CHAR(aChar)) // optimize for block which have no case
202     {
203         *aReturn = aChar;
204     }
205     else
206     {
207         PRUnichar upper;
208         upper = gUpperMap->Map(aChar);
209
210         if( 0x01C0 == ( upper & 0xFFC0)) // 0x01 Cx - 0x01 Fx
211         {
212            for(PRUint32 i = 0; i < gUpperToTitleItems; i++) {
213              if ( upper == gUpperToTitle[(i*2)+kUpperIdx]) {
214                *aReturn = gUpprrToTitle[(i*2)+kTitleIdx];
215                return NS_OK;
216              }
217            }
218         }
219         *aReturn = upper;
220     }
221     return NS_OK;
222 }
223
224 nsresult nsCaseConversionImp2::ToUpper(
225     const PRUnichar* anArray, PRUnichar* aReturn, PRUint32 aLen
226 )
227 {
228     PRUint32 i;
229     for(i=0;i<aLen;i++)
230     {
231        PRUnichar aChar = anArray[i];
232        if(IS_ASCII(aChar)) // optimize for ASCII
233        {
234            if(IS_ASCII_LOWER(aChar))
```

TABLE 9-continued

```
235             aReturn[i] = aChar - 0x0020;
236         else
237             aReturn[i] = aChar;
238     }
239     else if(IS_NOCASE_CHAR(aChar)) // optimize for block which have no case
240     {
241         aReturn[i] = aChar;
242     }
243     else
244     {
245       aReturn[i] = gUpperMap->Map(aChar);
246     }
247   }
248   return NS_OK;
249 }
250
251 nsresult nsCaseConversionImp2::ToLower(
252     const PRUnichar* anArray, PRUnichar* aReturn, PRUint32 aLen
253 )
254 {
255   PRUint32 i;
256   for(i=0;i<aLen;i++)
257   {
258     PRUnichar aChar = anArray[i];
259     if(IS_ASCII(aChar)) // optimize for ASCII
260     {
261       if(IS_ASCII_UPPER(aChar))
262         aReturn[i] = aChar + 0x0020;
263       else
264         aReturn[i] = aChar;
265     }
266     else if(IS_NOCASE_CHAR(aChar)) // optimize for block which have no case
267     {
268         aReturn[i] = aChar;
269     }
270     else
271     {
272       aReturn[i] = gLowerMap->Map(aChar);
273     }
274   }
275   return NS_OK;
276 }
277
278
279
280 nsresult nsCaseConversionImp2::ToTitle(
281     const PRUnichar* anArray, PRUnichar* aReturn, PRUint32 aLen,
282     PRBool aStartInWordBoundary
283 )
284 {
285   if(0 == aLen)
286     return NS_OK;
287
288 //
289 // We need to replace this implementation to a real one
290 // Currently, it only do the right thing for ASCII
291 // However, we need a word breaker to do the right job
292 //
293 // this->ToLower(anArray, aReturn, aLen);
294 // CSS define Capitalize as
295 // Uppercases the first character of each word
296 //
297
298   PRBool bLastIsSpace = IS_ASCII_SPACE(anArray[0]);
299   if(aStartInWordBoundary)
300   {
301       this->ToTitle(aReturn[0], &aReturn[0]);
302   }
303
304   PRUint32 i;
305   for(i=1;i<aLen;i++)
306   {
307     if(bLastIsSpace)
308     {
309       this->ToTitle(aReturn[i], &aReturn[i]);
310     }
311
312     bLastIsSpace = IS_ASCII_SPACE(aReturn[i]);
313   {
```

TABLE 9-continued

```
314    return NS_OK;
315 }
316
317
318
319 nsCaseConversionImp2::nsCaseConversionImp2()
320 {
321    if(gInit++ == 0) {
322       gUpperMap = new nsCompressedMap(&gToUpper[0], gToUpperItems);
323       gLowerMap = new nsCompressedMap(&gToLower[0], gToLowerItems);
324    {
325    NS_INIT_REFCNT();
326    PR_AtomicIncrement(&g_InstanceCount);
327 }
328
329 nsCaseConversionImp2::~nsCaseConversionImp2()
330 {
331    PR_AtomicDecrement(&g_InstanceCount);
332    if(--gInit == 0) {
333       delete gUpperMap;
334       gUpperMap = nsnull;
335       delete gLowerMap;
336       gLowerMap = nsnull;
337    }
338 }
339
340 nsresult NS_NewCaseConversion(nsISupports** oResult)
341 {
342    if(!oResult)
343       return NS_ERROR_NULL_POINTER;
344    *oResult = new nsCaseConversionImp2();
345    if(*oResult)
346       NS_ADDREF(*oResult);
347    return (*oResult) ? NS_OK: NS_ERROR_OUT_OF_MEMORY;
348 }
349
```

Although the invention is described herein with reference to the preferred embodiment, one skilled in the art will readily appreciate that other applications may substituted for those set forth herein without departing from the spirit and scope of the present invention. For example, the invention may be applied to perform pattern recognition where patterns of related information are found in otherwise unorganized lists. Accordingly, the invention should only be limited by the Claims included below.

What is claimed is:

1. A method for a computer system comprising at least one computer processing unit and at least one accessibly coupled computer memory, said computer system executing a program operating system of program code segments residing in said at least one accessibly coupled computer memory for encoding case mappings, said method comprising the steps of:

a program code segment compressing characters having more than one case into a list;

a program code segment expressing each character in said list as a quadruple, wherein every quadruple represents a range of characters, wherein said quadruple is expressed as follows:

<Minimum, Size, Gap, Offset>; and wherein Minimum and Size values represent the boundary of a range, Gap represents which characters in said range which have a valid mapping, and a mapped value is the character plus the Offset if the character has a mapping;

given an input character and a case mapping encoded in a sequential list of a first <Minimum, Size, Gap, Offset> quadruple, a program code segment using a first predetermined number of bits to encode Minimum and Offset, and using a second predetermined number of bits to encode Size and Gap; and a program code segment performing a binary search for said input character on said sequential list of said first <Minimum, Size, Gap, Offset> quadruple;

if (Minimum<=said input character && (said input character<=(Minimum+Size)), then finding an associated match quadruple; and otherwise, continuing said binary search;

wherein it said associated match quadruple cannot be found, the mapped value of said input character is said input character itself.

2. The method of claim 1, wherein if Gap in said associated match quadruple is 1 ((said input character–Minimum) mod Gap) equal to zero, then the mapped value of said input character is (said input character+Offset).

3. A method for a computer system comprising at least one computer processing unit and at least one accessibly coupled computer memory, said computer system executing a program operating system of program code segments residing in said at least one accessibly coupled computer memory for outputting a case string given a string as input, said method comprising the steps of:

a program code segment providing a while loop to process one string at a time;

a program code segment performing a 1-to-1 character case mapping of one string to said string's other case;

a program code segment optimizing for characters which have no case information; and a program code segment using a list of <minimum, size, gap, offset> quadruple to encode Unicode characters;

wherein said string is a Unicode.

4. The method of claim 3, further comprising the step of: performing special case mapping.

5. A method for a computer system comprising at least one computer processing unit and at least one accessibly coupled computer memory, said computer system executing a program operating system of program code segments residing in said at least one accessibly coupled computer memory for 1-to-1 character case mapping, said method comprising the steps of:

a program code segment compressing a 1-to-1 case mapping to a lookup table;

a program code segment optimizing performance of a table lookup;

a program code segment optimizing for characters which have no case information; and a program code segment using a list of <minimum, size, gap, offset> quadruple to encode Unicode characters of said characters.

6. The method of claim 5, further comprising the step of: optimizing for ASCII range.

7. The method of claim 5, further comprising the step of: optimizing with a cache.

8. A binary tree algorithm for a computer system comprising at least one computer processing unit and at least one accessibly coupled computer memory, said computer system executing a program operating system of program code segments residing in said at least one accessibly coupled computer memory for accessing case information from a compressed array, said algorithm comprising the steps of:

locating a valid record by searching a binary tree In which ((entry->start<=input) && (input<=(entry->start+entry->size));

if no record match, returning output=input;

if entry->size equal to 0 returning output=input+entry->offset (entry->gap should be ignored if entry->size equal to 0);

if (input−entry->start) mod entry->gap equal to 0, returning output=input+entry->offset; and otherwise, returning output=input.

9. A method for a computer system comprising at least one computer processing unit and at least one accessibly coupled computer memory, said computer system executing a program operating system of program code segments residing in said at least one accessibly coupled computer memory for case mapping, said method comprising the steps of:

a program code segment providing an input Unicode character;

a program code segment using a table of <Minimum, Size, Gap, Offset> quadruple to encode Unicode characters in an upper/lower case character mapping;

wherein Minimum and Size values represent the boundary of a range, Gap represents which characters in said range which have a valid mapping, and a mapped value is the character plus the Offset if the character has a mapping; and a program code segment performing a table look up to return an appropriate output Unicode character for said input Unicode character, wherein before using said lookup table, checking said input to see said character is an ASCII character, if said character is an ASCII character, using conditional offset method to optimize for speed.

10. The method of claim 9, further comprising the step of: examining a character to determine if it has a different case;

wherein it is only necessary to perform case mapping for those characters which have different case.

11. The method of claim 9, further comprising the step of: providing a cache to cache table lookup result.

12. A method for a computer system comprising at least one computer processing unit and at least one accessibly coupled computer memory, said computer system executing a program operating system of program code segments residing in said at least one accessibly coupled computer memory for performing pattern recognition to map information where patterns of related information are found in otherwise unorganized lists, said method comprising the steps of:

a program code segment compressing information having one or more related occurrences into a list;

a program code segment expressing said information in said list as a quadruple, wherein every quadruple represents a range of said information; wherein said quadruple is expressed as follows:

<Minimum, Size, Gap, Offset>; and wherein Minimum and Size values represent the boundary of a range, Gap represents which occurrences of said information are in said range which have a valid mapping, and a mapped value is the occurrence of said information plus the Offset if the information has a mapping;

given input information and a mapping encoded in a sequential list of a first <Minimum, Size, Gap, Offset> quadruple, a program code segment using a first predetermined number of bits to encode Minimum and Offset, and using a second predetermined number of bits to encode Size and Gap; and a program code segment performing a binary search for said input information on said sequential list of said first <Minimum, Size, Gap, Offset> quadruple.

13. An apparatus for encoding case mappings, said apparatus comprising a computer system comprising at least one computer processing unit and at least one accessibly coupled computer memory, said computer system executing a program operating system of program code segments residing in said at least one accessibly coupled computer memory, said apparatus comprising:

a program code segment for providing a plurality of input characters;

a program code segment for providing a compressor for compressing characters having more than one case into a list;

a program code segment for providing a quadruple for expressing each character in said list, wherein said quadruple represents a range of characters, and wherein said quadruple is expressed as follows:

<Minimum, Size, Gap, Offset>; and wherein Minimum and Size values represent the boundary of a range, Gap represents which characters in said range which have a valid mapping, and the a mapped value is the character plus the Offset if the character has a mapping;

a program code segment for providing performing a binary search for an input character on said sequential list of a first <Minimum, Size, Gap, Offset> quadruple; if (Minimum<=said input character && ([said Input character<=(Minimum+Size)), then finding an associated match quadruple; otherwise, continuing said binary search; wherein if said associated match quadruple cannot be found, the mapped value of said input character is said input character itself; wherein if Gap in said associated match quadruple is 1 ((said input character−Minimum) mod Gap) equal to zero, then the mapped value of said input character is (said input character +Offset); and a program code segment for providing a plurality of output characters generated by a look up to said list with said input characters.

14. The apparatus of claim 13, wherein said input and output characters comprise Unicode characters.

15. An apparatus for 1-to-1 character case mapping, said apparatus comprising a computer system comprising at least one computer processing unit and at least one accessibly coupled computer memory, said computer system executing a program operating system of program code segments residing in said at least one accessibly coupled computer memory, said apparatus comprising:

a program code segment for providing a plurality of input characters;

a program code segment for providing a compressor for compressing a 1-to-1 character case mapping to a lookup table;

at least one module for optimizing performance of a table lookup, wherein said at least one module optimizes for characters which have no case information;

a program code segment for providing a plurality of output characters generated by a look up to said look up table with said input characters; and a program code segment for providing using a list of <minimum, size, gap, offset> quadruple to encode Unicode characters.

16. The apparatus of claim 15, wherein said at least one module optimizes for ASCII range.

17. The apparatus of claim 15, further comprising:

a cache to cache table lookup result.

18. A binary tree algorithm for accessing case information from a compressed array for a computer system comprising at least one computer processing unit and at least one accessibly coupled computer memory, said computer system executing a program operating system of program code segments residing in said at least one accessibly coupled computer memory, said algorithm comprising:

a program code segment locating a valid record by searching a binary tree in which ((entry->start<=input) && (input<=(entry->start+entry->size)); if no record match, returning output=input; if entry->size equal to 0, returning output=input+entry->offset (entry->gap should be ignored if entry->size equal to 0); If (input−entry->start) mod entry->gap equal to 0, returning output=input+entry->offset; and otherwise, returning output=input; and an output a program code segment outputting a valid record located by said module for locating.

19. An apparatus for case mapping, said apparatus comprising a computer system comprising at least one computer processing unit and at least one accessibly coupled computer memory, said computer system executing a program operating system of program code segments residing in said at least one accessibly coupled computer memory, said apparatus comprising:

a program code segment for providing an input Unicode character;

a program code segment for providing a table of <Minimum, Size, Gap, Offset> quadruple for encoding Unicode characters in an upper/lower case character mapping; wherein Minimum and Size values represent the boundary of a range, Gap represents which characters in said range which have a valid mapping, and a mapped value is the character plus the Offset if the character has a mapping;

a program code segment performing a table look up to return an appropriate output Unicode character for said input Unicode character; and an optimization program code segment checking said input to see said character is an ASCII character before using said lookup table; and if said character is an ASCII character, for using a conditional offset method to optimize for speed.

20. The apparatus of claim 19, further comprising:

an optimization module for examining a character to determine if it has a different case;

wherein it is only necessary to perform case mapping for those characters which have different case.

21. The apparatus of claim 19, further comprising:

a cache to cache table lookup result.

22. The method of claim 1, wherein said first predetermined number is sixteen and said second predetermined number is eight.

23. The method of claim 12, wherein said first predetermined number is sixteen and said second predetermined number is eight.

* * * * *